US010697773B2

(12) United States Patent
Furuhata et al.

(10) Patent No.: US 10,697,773 B2
(45) Date of Patent: Jun. 30, 2020

(54) PHYSICAL QUANTITY SENSOR, METHOD FOR MANUFACTURING PHYSICAL QUANTITY SENSOR, PHYSICAL QUANTITY SENSOR DEVICE, ELECTRONIC APPARATUS, AND VEHICLE

(71) Applicant: Seiko Epson Corporation, Tokyo (JP)

(72) Inventors: Makoto Furuhata, Matsumoto (JP); Kei Kanemoto, Fujimi (JP)

(73) Assignee: Seiko Epson Corporation (JP)

( * ) Notice: Subject to any disclaimer, the term of this patent is extended or adjusted under 35 U.S.C. 154(b) by 165 days.

(21) Appl. No.: 15/948,174

(22) Filed: Apr. 9, 2018

(65) Prior Publication Data

US 2018/0306581 A1     Oct. 25, 2018

(30) Foreign Application Priority Data

Apr. 25, 2017 (JP) ................................. 2017-086119

(51) Int. Cl.
| | |
|---|---|
| *G01C 19/00* | (2013.01) |
| *G01P 3/00* | (2006.01) |
| *B60W 30/02* | (2012.01) |
| *B60W 10/22* | (2006.01) |
| *G01C 19/5733* | (2012.01) |
| *G01P 3/22* | (2006.01) |
| *G01C 19/5769* | (2012.01) |

(Continued)

(52) U.S. Cl.
CPC ....... *G01C 19/5733* (2013.01); *B60W 10/184* (2013.01); *B60W 10/22* (2013.01); *B60W 30/02* (2013.01); *B81B 3/0051* (2013.01); *B81B 3/0078* (2013.01); *G01C 19/574* (2013.01); *G01C 19/5769* (2013.01); *G01P 3/22* (2013.01); *B60W 2420/10* (2013.01); *B81B 2201/0242* (2013.01)

(58) Field of Classification Search
CPC .... B60W 10/00; B60W 10/22; B60W 10/184; B60W 30/00; B60W 30/02; B81B 1/00; B81B 3/00; B81B 3/0051; B81B 3/0078; G01C 19/00; G01C 19/574; G01C 19/5769; G01P 3/22
See application file for complete search history.

(56) References Cited

U.S. PATENT DOCUMENTS

| | | |
|---|---|---|
| 5,969,225 A | 10/1999 | Kobayashi |
| 6,571,630 B1 | 6/2003 | Weinberg et al. |

(Continued)

FOREIGN PATENT DOCUMENTS

JP     2002-540406 A     11/2002

OTHER PUBLICATIONS

Extended European Search Report for Application No. EP 18 16 9021 dated Aug. 24, 2018 (7 pages).

*Primary Examiner* — Yonel Beaulieu
(74) *Attorney, Agent, or Firm* — Harness, Dickey & Pierce, P.L.C.

(57) ABSTRACT

A physical quantity sensor includes a driven section and a drive spring that supports the driven section so that the driven section is displaceable in a first direction. The drive spring has a serpentine shape and includes a plurality of spring structures extending in a second direction that intersects a first direction. At least one of the spring structures has a thin section that is thinner in a third direction that intersects the first and second directions than the other portions of the drive spring.

19 Claims, 19 Drawing Sheets

(51) Int. Cl.
*B60W 10/184* (2012.01)
*B81B 3/00* (2006.01)
*G01C 19/574* (2012.01)

(56) References Cited

U.S. PATENT DOCUMENTS

| | | |
|---|---|---|
| 7,213,458 B2 | 5/2007 | Weber et al. |
| 2004/0154400 A1 | 8/2004 | Johnson et al. |
| 2009/0199637 A1* | 8/2009 | Sugiura ............... G01P 15/0802 73/514.32 |
| 2012/0085168 A1 | 4/2012 | Klemetti et al. |
| 2012/0125101 A1 | 5/2012 | Seeger et al. |
| 2014/0144232 A1 | 5/2014 | Lin et al. |
| 2017/0003314 A1* | 1/2017 | Waters .................. G01P 15/125 |

* cited by examiner

PHYSICAL QUANTITY SENSOR, METHOD FOR MANUFACTURING PHYSICAL QUANTITY SENSOR, PHYSICAL QUANTITY SENSOR DEVICE, ELECTRONIC APPARATUS, AND VEHICLE

BACKGROUND

1. Technical Field

The present invention relates to a physical quantity sensor, a method for manufacturing the physical quantity sensor, a physical quantity sensor device, an electronic apparatus, and a vehicle.

2. Related Art

A known gyro sensor (angular velocity sensor) configuration is described in JP-T-2002-540406. The gyro sensor described in JP-T-2002-540406 includes a frame that can vibrate in an X-axis direction, a proof mass disposed inside the frame, a single spring structure that links the proof mass and the frame to each other so that the proof mass is displaceable relative to the frame in a Y-axis direction, and a sense electrode disposed so as to face the proof mass.

When angular velocity around a Z axis (axis perpendicular to both X axis and Y axis) acts on the thus configured gyro sensor in a state in which the frame vibrates along with the proof mass in the X-axis direction (the state is hereinafter referred to as a "drive vibration mode"), a Coriolis force displaces the proof mass in the Y-axis direction, and the capacitance between the proof mass and the sense electrode changes.

The angular velocity can therefore be detected based on the change in the capacitance.

In the gyro sensor described in JP-T-2002-540406, if the cross-sectional shape of the spring structure deviates from a rectangular shape, for example, if the spring structure has a parallelogrammatic cross-sectional shape, the frame and the proof mass undesirably vibrate not only in the X-axis direction but also in the Y-axis direction in the drive vibration mode (that is, unnecessary vibration (quadrature) in Y-direction occurs). JP-T-2002-540406 points out that the unnecessary vibration undesirably degrades the angular velocity detection characteristic.

JP-T-2002-540406 proposes to reduce the unnecessary vibration (quadrature) by irradiating a surface of the spring structure with laser light so that the surface undergoes laser ablation (removal) or by depositing a material on the spring structure.

However, the laser ablation performed on a surface of the spring structure or the deposition of a material on the spring structure undesirably reduces the unnecessary vibration (quadrature) by an insufficient amount.

SUMMARY

An advantage of some aspects of the invention is to provide a physical quantity sensor that allows reduction in unnecessary vibration, a method for manufacturing the physical quantity sensor, a physical quantity sensor device, an electronic apparatus, and a vehicle.

The advantage can be achieved by the following configurations.

A physical quantity sensor according to an aspect of the invention includes a driven section and a spring that supports the driven section. The driven section and the spring are arranged in a first direction. The spring includes a plurality of spring structures having a longitudinal direction extending along a second direction perpendicular to the first direction and folding sections that each connect same-one-side ends of adjacent two spring structures of the plurality of spring structures. At least any of the plurality of spring structures includes a thin section thinner than other spring structures along a third direction perpendicular to the first and second directions.

Providing the drive spring with the thin section as described above allows reduction in a third-direction vibration component of the drive spring and reduction in displacement of the driven section in a direction other than the first axial direction.

That is, unnecessary vibration (quadrature) of the driven section can be reduced.

In the physical quantity sensor according to the aspect of the invention, it is preferable that the thin section is provided by forming a recess in the at least any of the spring structures and on one side in the third direction.

The thin section can therefore be readily formed.

In the physical quantity sensor according to the aspect of the invention, it is preferable that the plurality of spring structures each have an elongated cross-sectional shape in a plan view in the second direction, and that long sides of the elongated shape incline with respect to the third direction.

The cross-sectional shape is a shape that tends to be formed due to processing errors, the characteristics of a processing apparatus, and other factors.

Since the drive spring having the cross-sectional shape tends to have a third-direction vibration component, the effect of the aspect of the invention is provided in a more noticeable manner.

In the physical quantity sensor according to the aspect of the invention, it is preferable that the at least any of the spring structures is a spring structure located on a front end side in a direction in which the long sides incline.

The third-direction vibration component of the drive spring can therefore be effectively reduced, whereby the unnecessary vibration (quadrature) of the driven section can be reduced.

In the physical quantity sensor according to the aspect of the invention, it is preferable that at least two of the plurality of spring structures are each provided with the thin section.

The third-direction vibration component of the drive spring can therefore be more effectively reduced.

Further, since the amounts of reduction in the third-direction vibration component of the drive spring per unit length of the thin section differ from one another among the plurality of spring structures, separately providing the plurality of spring structures with the thin sections allows coarse and fine adjustments of the third-direction vibration component of the drive spring.

The third-direction vibration component of the drive spring can therefore be reduced with increased accuracy.

In the physical quantity sensor according to the aspect of the invention, it is preferable that the thin sections provided in the at least two spring structures have the same thickness.

The plurality of thin sections can therefore be formed in the same step.

The number of steps of manufacturing the physical quantity sensor can therefore be reduced.

The physical quantity sensor can therefore be manufactured in a shorter period at lower cost.

In the physical quantity sensor according to the aspect of the invention, it is preferable that a width of each of the spring structures along the first direction is smaller than a distance by which adjacent two of the spring structures are separate from each other.

As a result, spring structures adjacent to each other are sufficiently separate from each other. Therefore, for example, when the thin section is formed in a certain spring structure, the possibility of damage of an adjacent spring structure can be effectively lowered.

A method for manufacturing a physical quantity sensor according to another aspect of the invention includes patterning a substrate by using dry etching to form an element including a driven section, and a spring that supports the driven section. The driven section and the spring arranged in a first direction. The spring includes a plurality of spring structures having a longitudinal direction extending along a second direction perpendicular to the first direction, and folding sections that each connect same-one-side ends of adjacent two spring structures of the plurality of spring structures. The method further includes forming, in at least any of the plurality of spring structures, a thin section thinner than other spring structures along a third direction perpendicular to the first and second directions.

Forming the thin section in the drive spring as described above allows reduction in a third-direction vibration component of the drive spring and reduction in unnecessary vibration (quadrature) of the driven section.

A physical quantity sensor having an excellent physical quantity detection characteristic is therefore provided.

In the method for manufacturing a physical quantity sensor according to the aspect of the invention, it is preferable that the formation of the thin section includes forming the thin section by processing the spring via a mask by using the dry etching.

The thin section can therefore be formed with increased precision.

A physical quantity sensor device according to another aspect of the invention includes the physical quantity sensor according to the aspect of the invention, and a circuit element electrically connected to the physical quantity sensor.

A reliable physical quantity sensor device that can benefit from the effects of the physical quantity sensor described above is therefore provided.

An electronic apparatus according to another aspect of the invention includes the physical quantity sensor according to the aspect of the invention.

A reliable electronic apparatus that can benefit from the effects of the physical quantity sensor described above is therefore provided.

A vehicle according to another aspect of the invention includes the physical quantity sensor according to the aspect of the invention, and an attitude controller that controls an attitude of the vehicle based on a detection signal outputted from the physical quantity sensor.

A reliable vehicle that can benefit from the effects of the physical quantity sensor described above is therefore provided.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

A physical quantity sensor, a method for manufacturing the physical quantity sensor, a physical quantity sensor device, an electronic apparatus, and a vehicle according to embodiments of the invention will be described below in detail with reference to the accompanying drawings.

First Embodiment

A physical quantity sensor according to a first embodiment of the invention will be described first.

Figure 1:
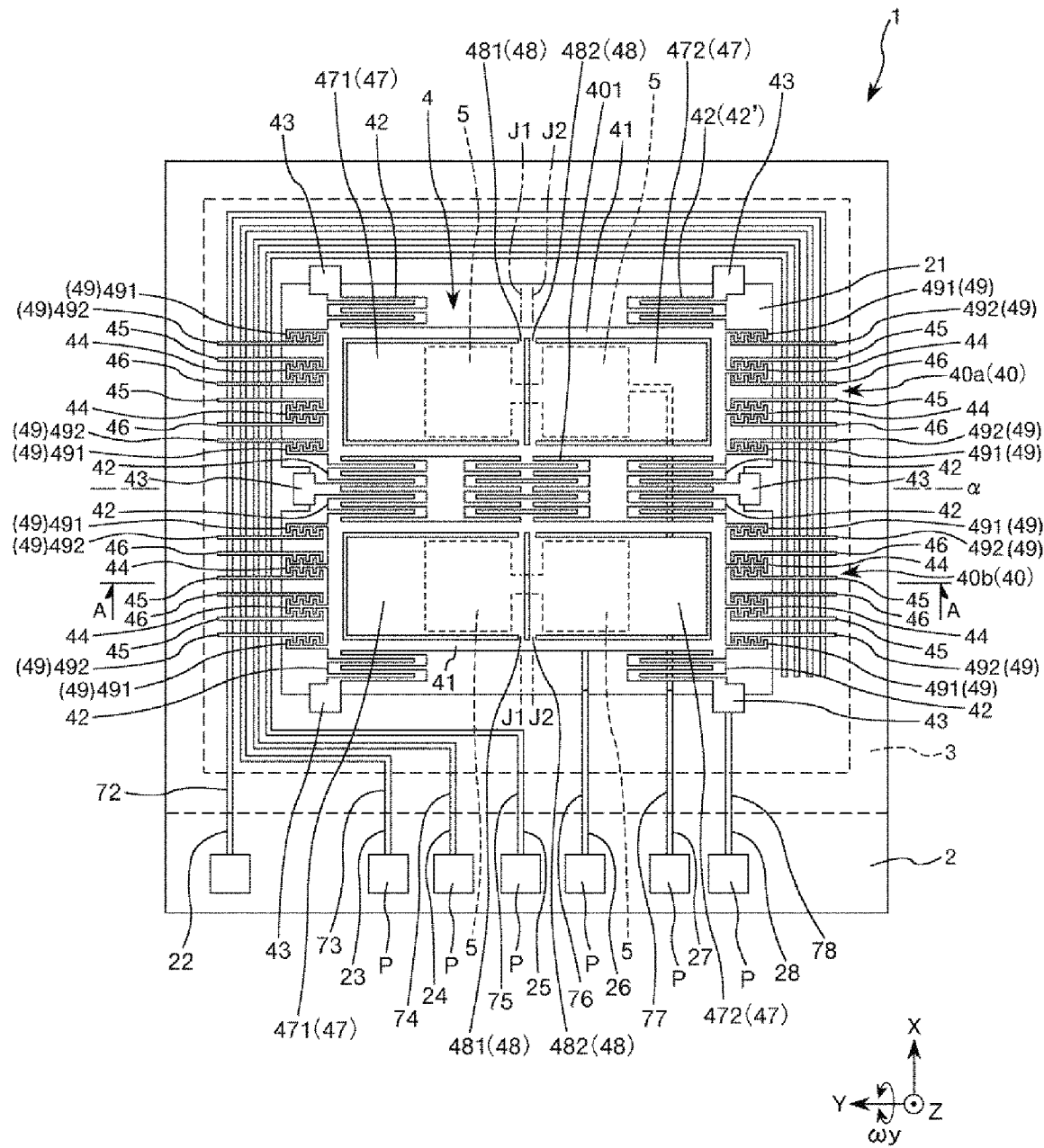
FIG. 1 is a plan view showing a physical quantity sensor according to a first embodiment of the invention.
Figure 2:
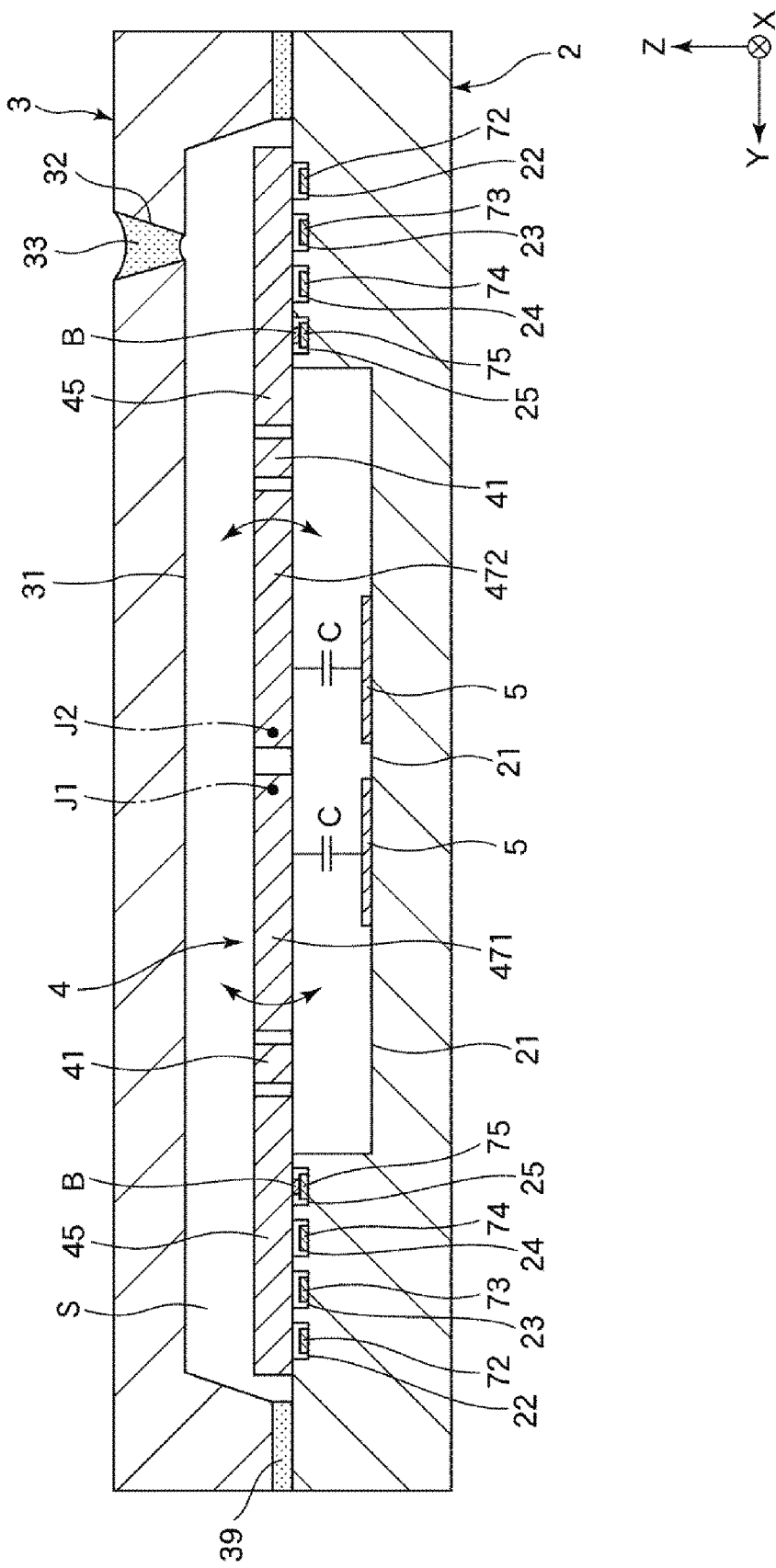
FIG. 2 is a cross-sectional view taken along the line A-A in FIG. 1.
Figure 3:
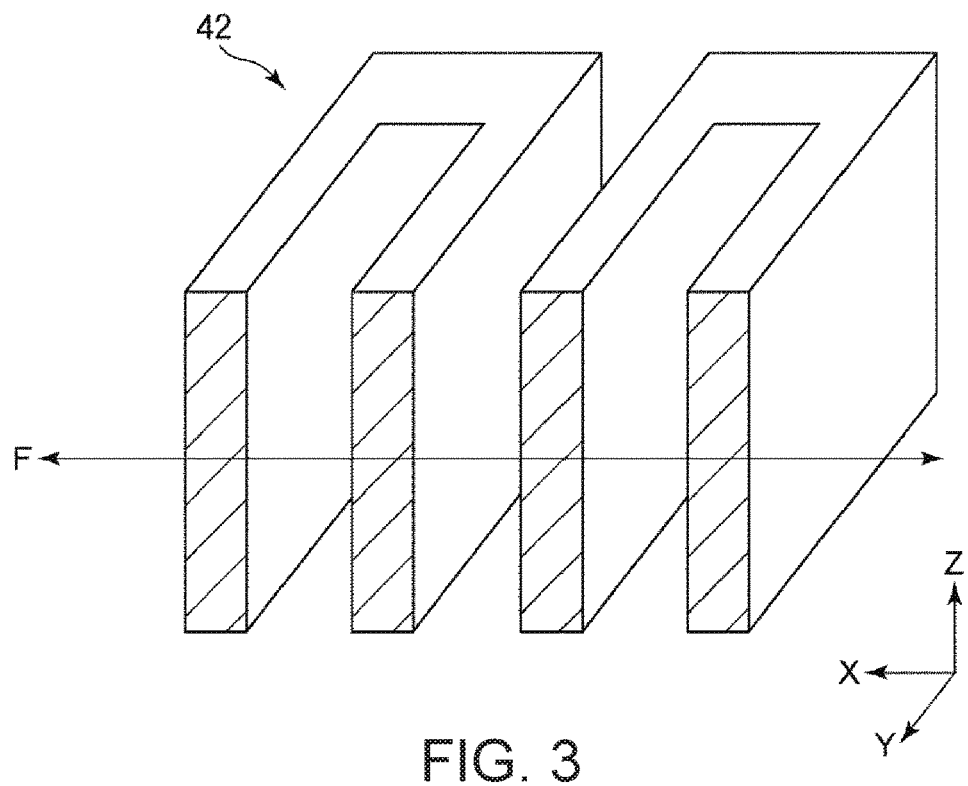
FIG. 3 is a perspective cross-sectional view of a drive spring.
Figure 4:
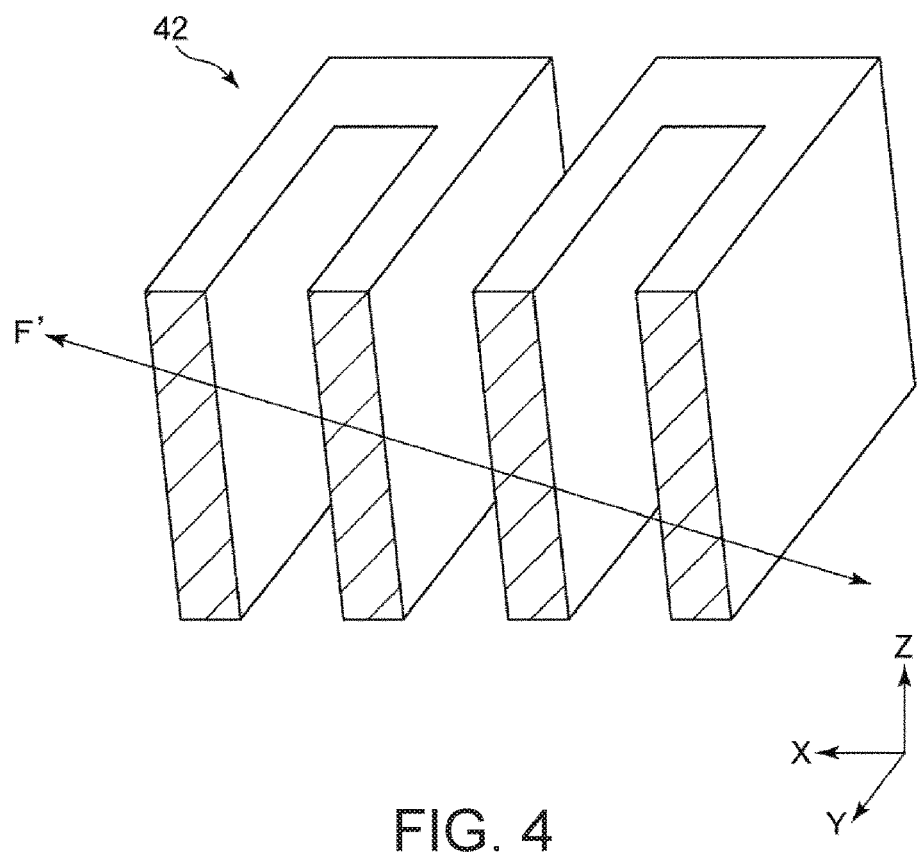
FIG. 4 is a perspective cross-sectional view of another drive spring.
Figure 5:
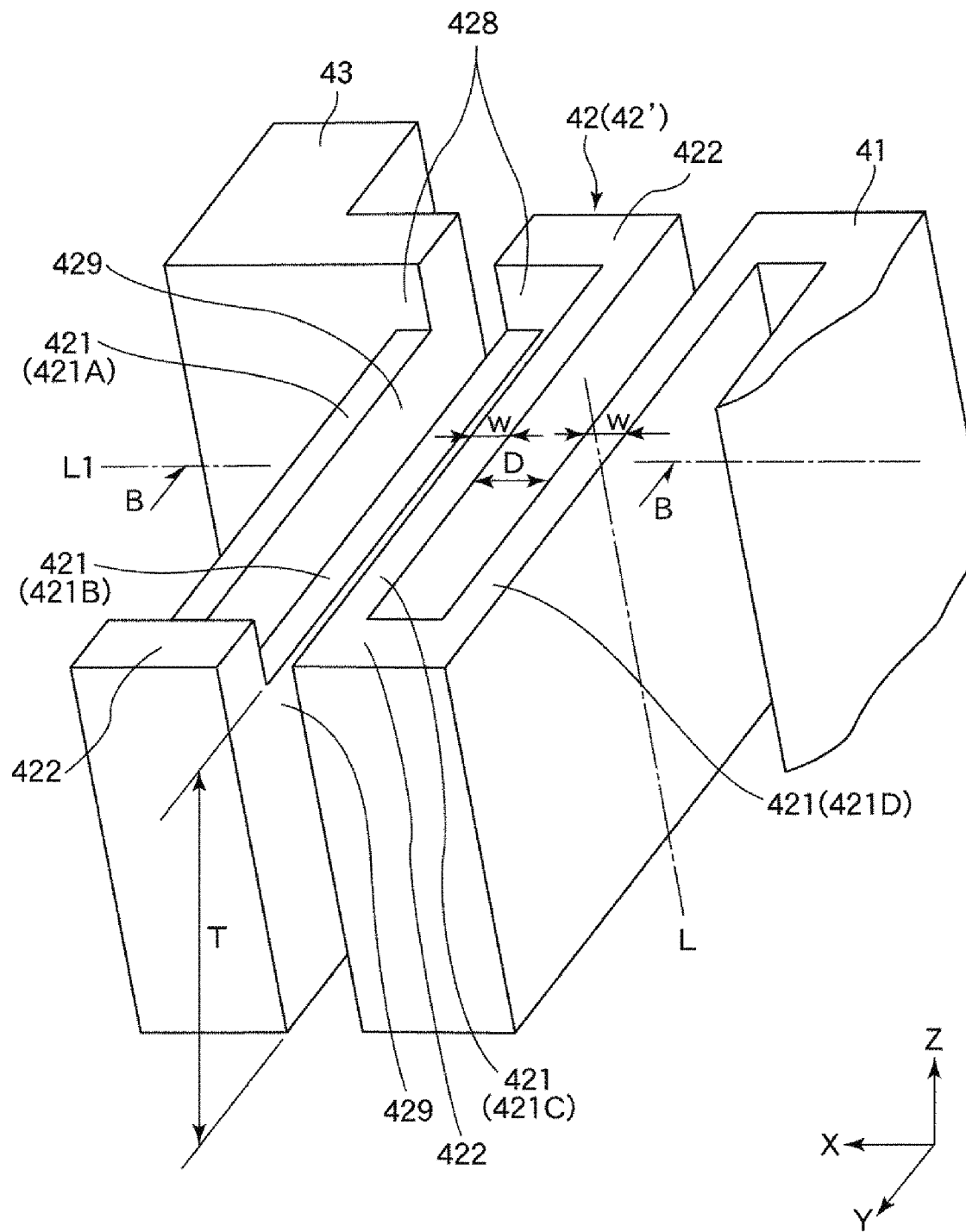
FIG. 5 is a perspective view of a drive spring provided in the physical quantity sensor shown in FIG. 1.
Figure 6:
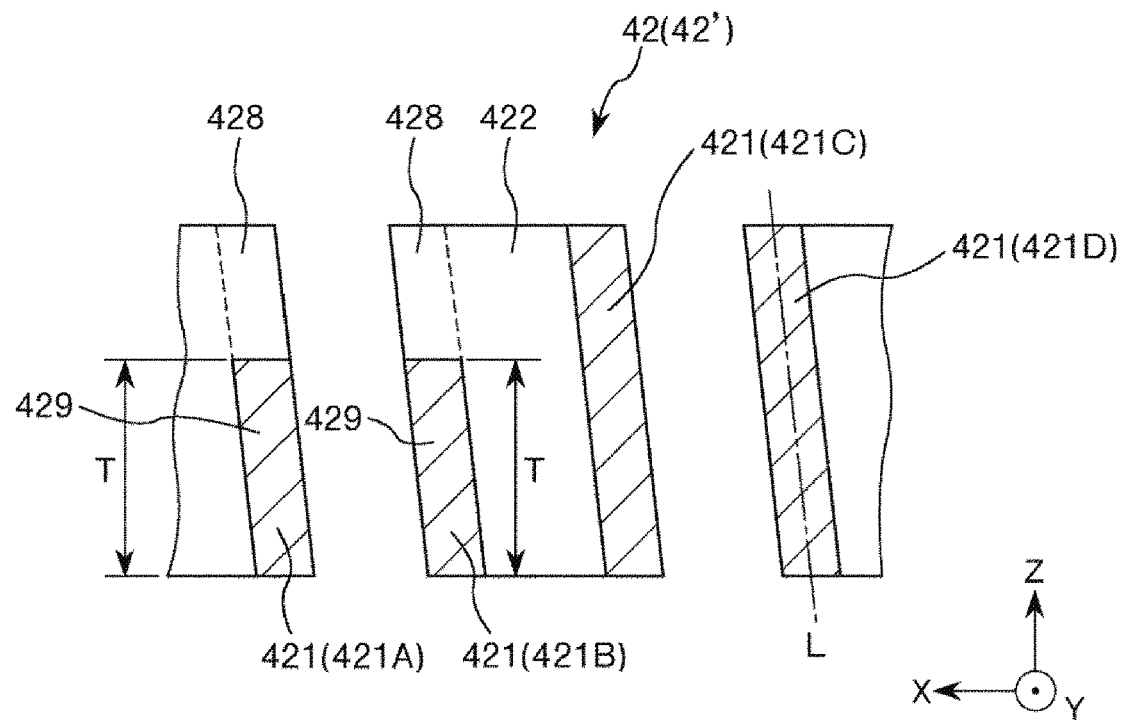
FIG. 6 is a cross-sectional view taken along the line B-B in FIG. 5.
Figure 7:
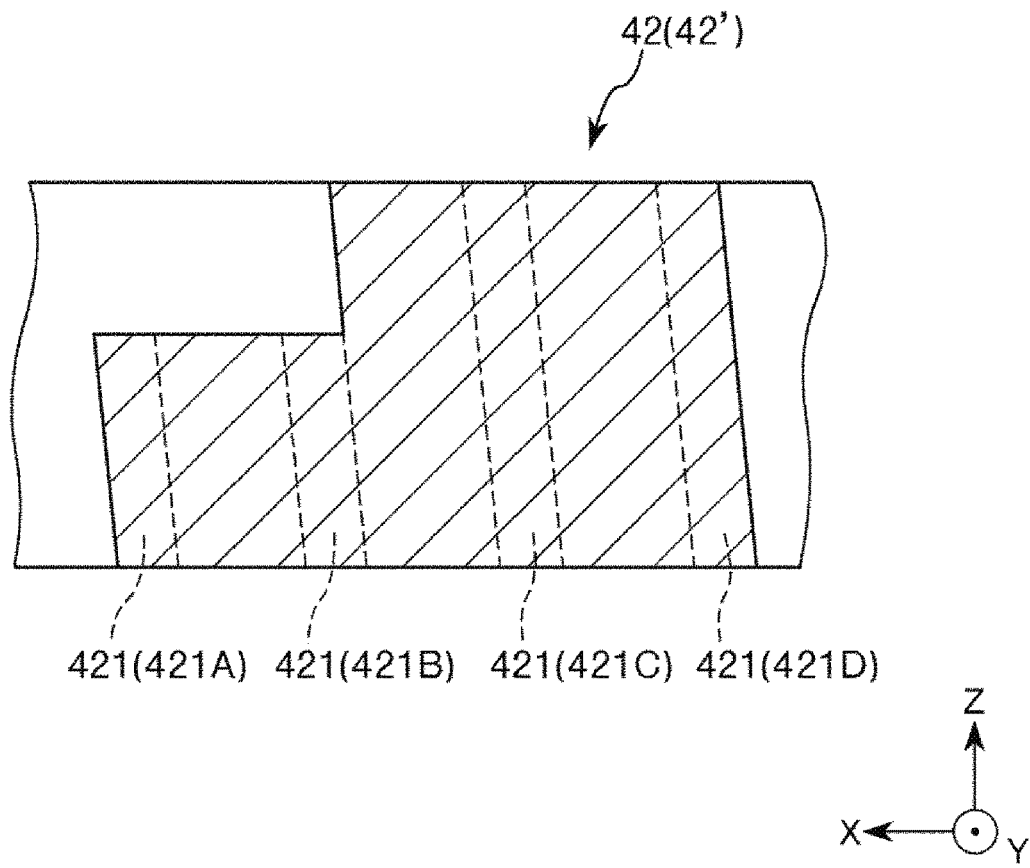
FIG. 7 is a cross-sectional view showing that a plurality of spring structures provided in the drive spring are integrated with one another into a single spring structure.
Figure 8:
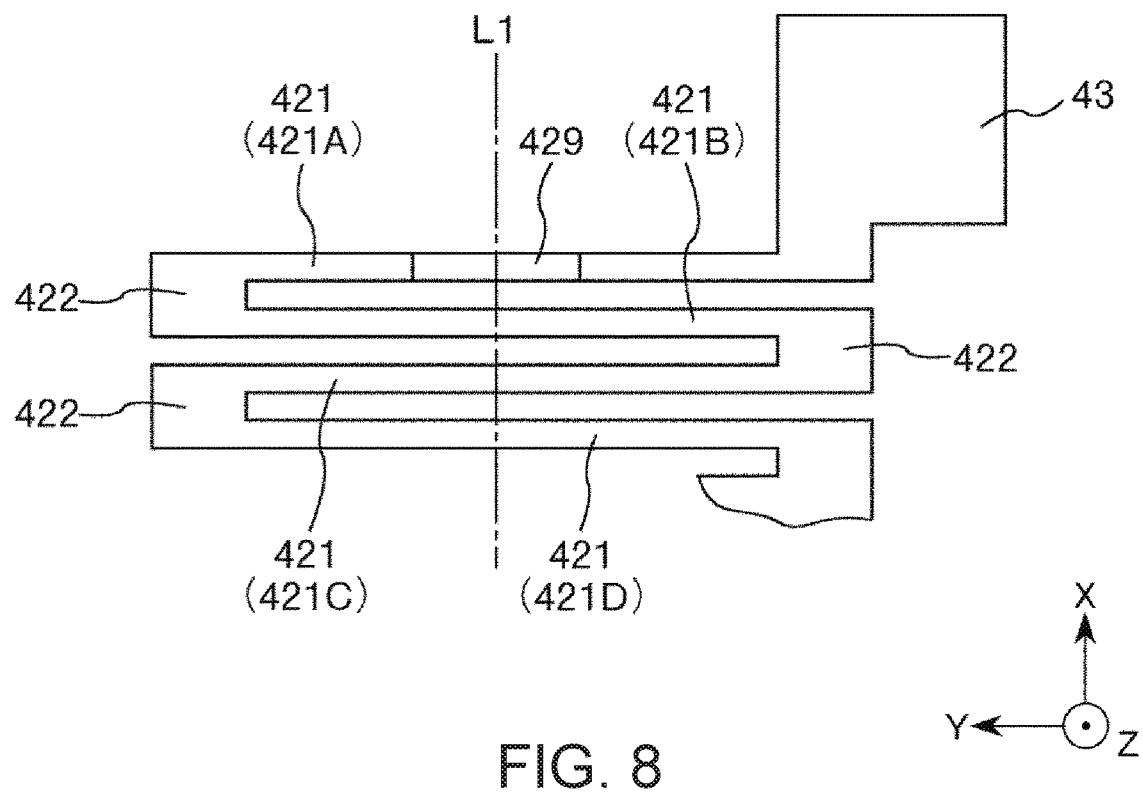
FIG. 8 is a plan view showing a variation of the drive spring shown in FIG. 5.
Figure 9:
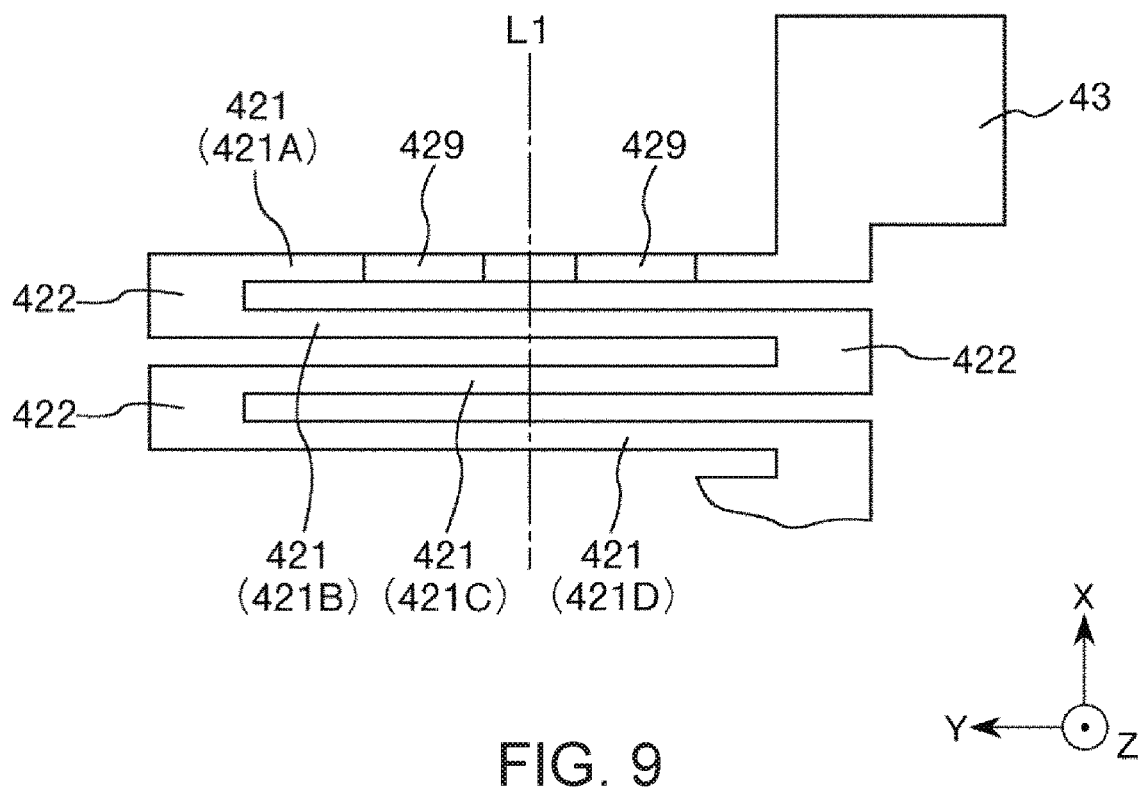
FIG. 9 is a plan view showing another variation of the drive spring shown in FIG. 5.
Figure 10:
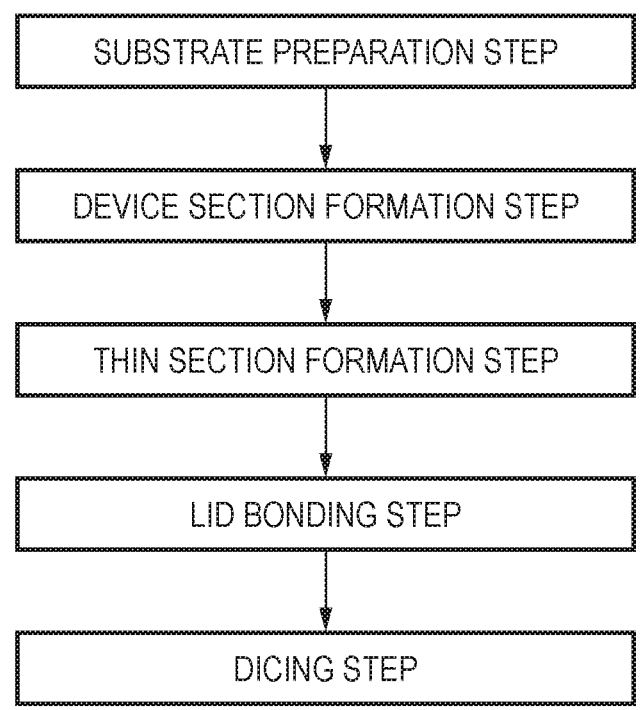
FIG. 10 is a flowchart showing the steps of manufacturing the physical quantity sensor shown in FIG. 1.
Figure 11:
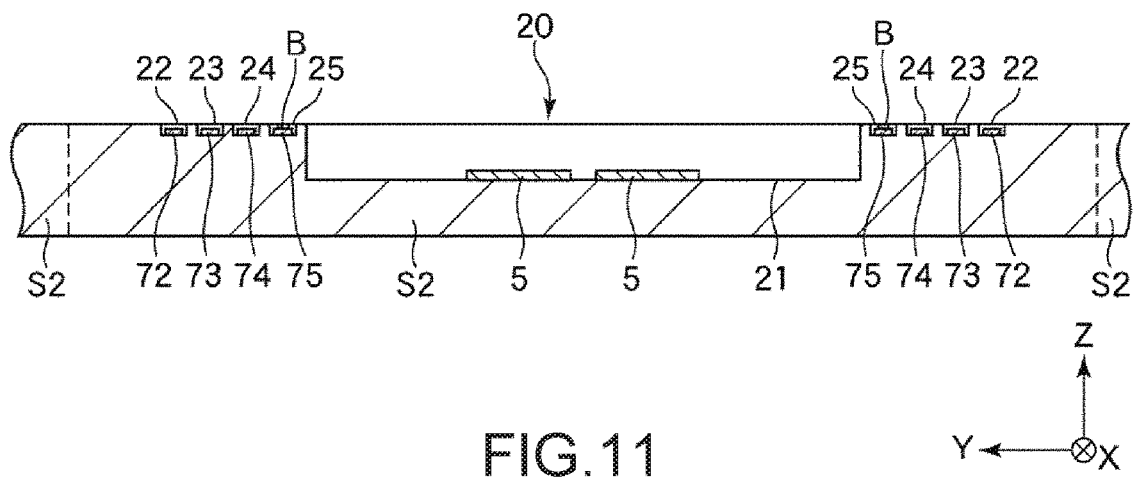
FIG. 11 is a cross-sectional view for describing the method for manufacturing the physical quantity sensor shown in FIG. 1.
Figure 12:
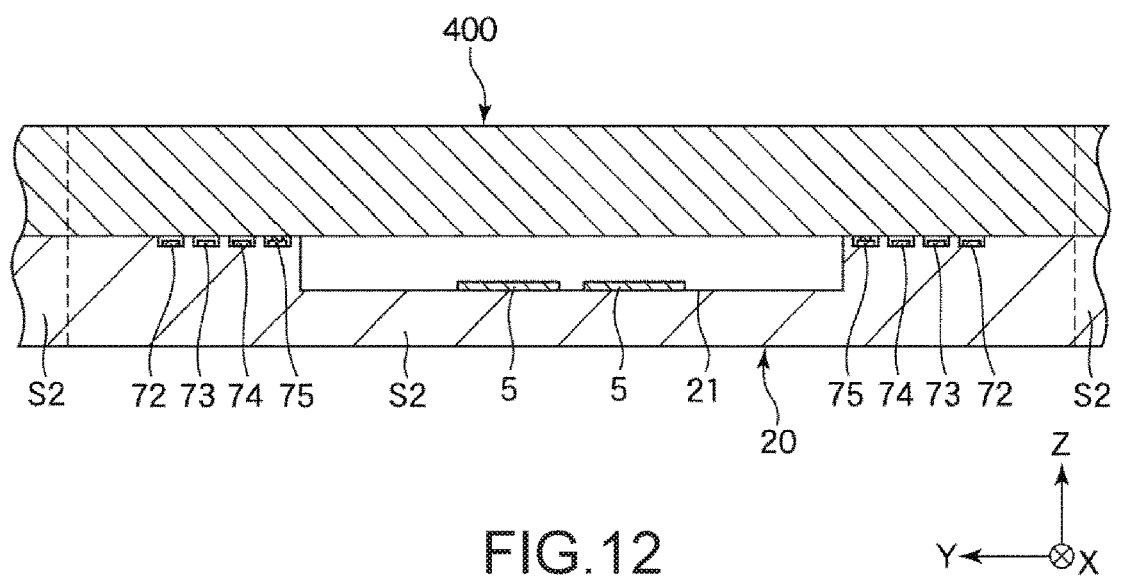
FIG. 12 is a cross-sectional view for describing the method for manufacturing the physical quantity sensor shown in FIG. 1.
Figure 13:
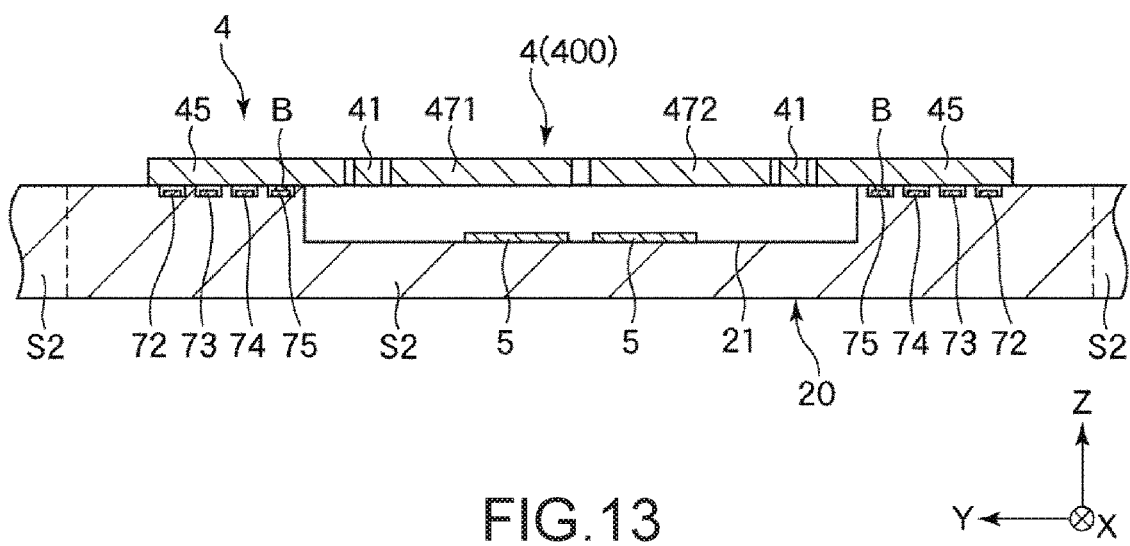
FIG. 13 is a cross-sectional view for describing the method for manufacturing the physical quantity sensor shown in FIG. 1.
Figure 14:
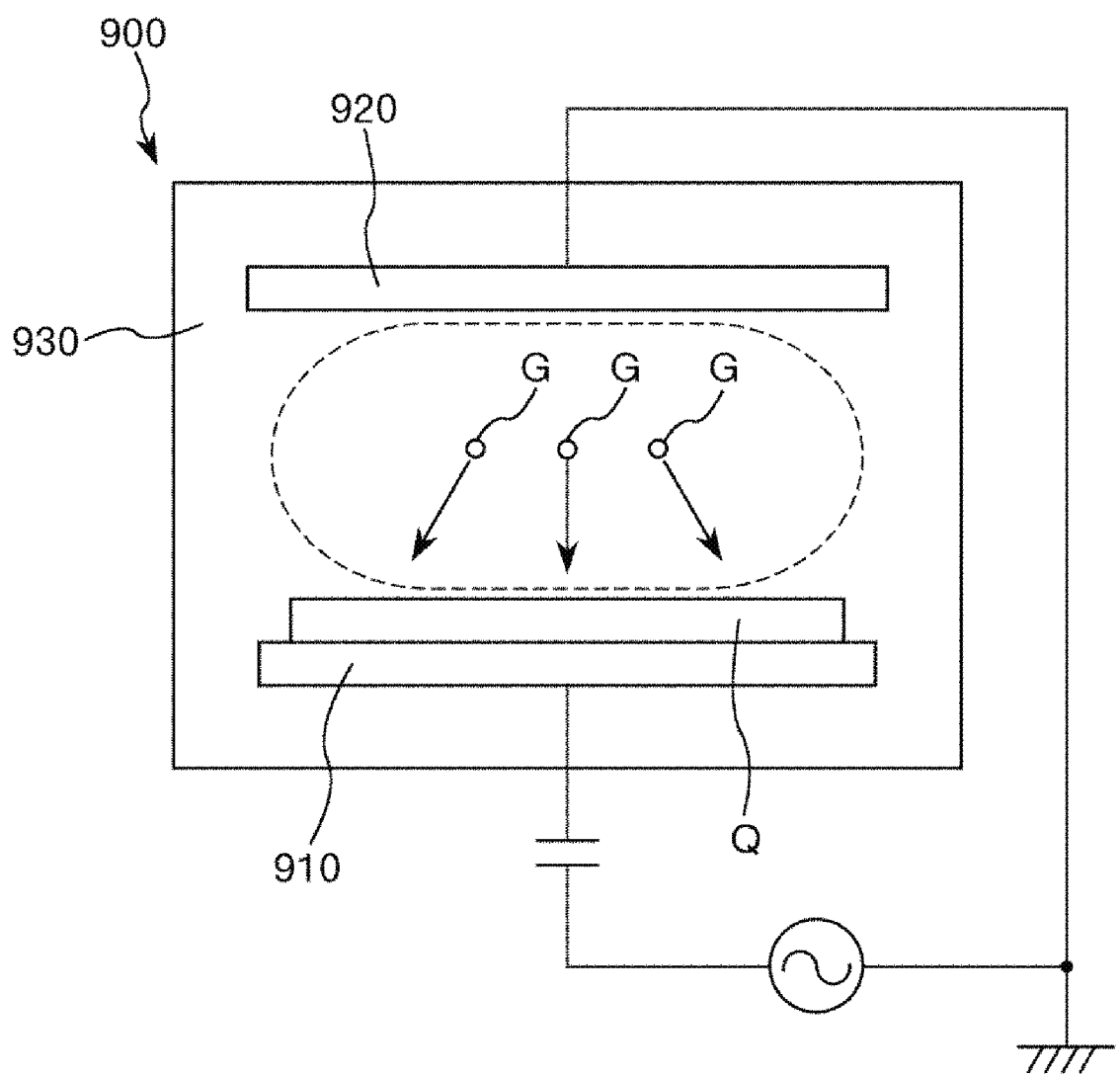
FIG. 14 is a schematic configuration diagram of an etcher.
Figure 15:
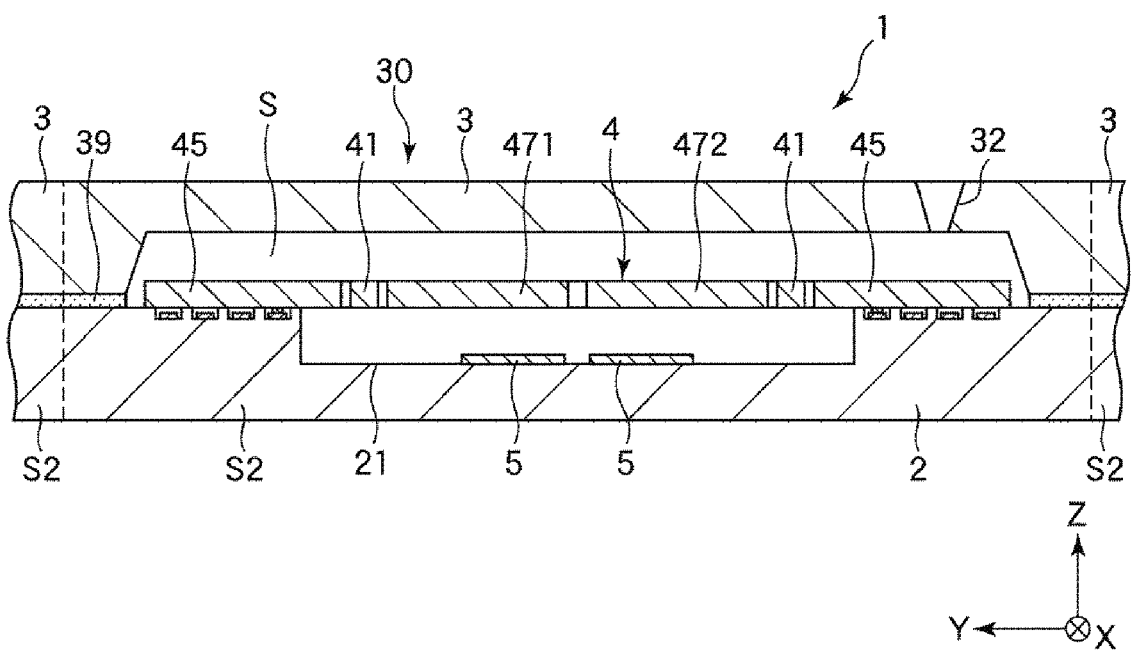
FIG. 15 is a cross-sectional view for describing the method for manufacturing the physical quantity sensor shown in FIG. 1.
Figure 16:
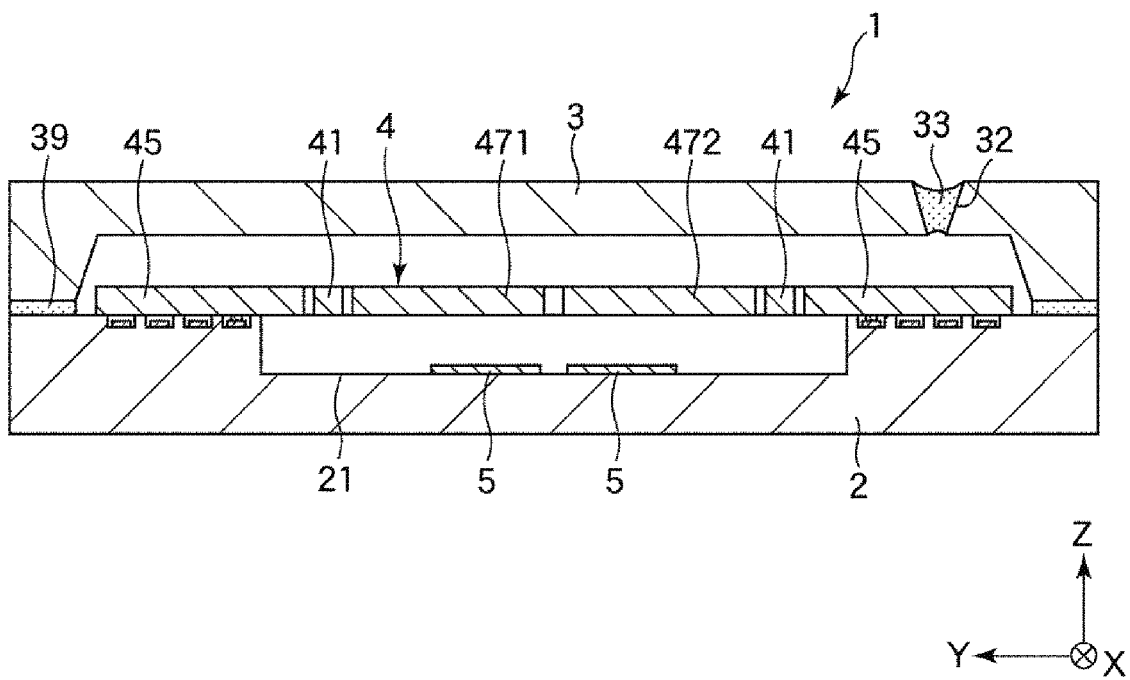
FIG. 16 is a cross-sectional view for describing the method for manufacturing the physical quantity sensor shown in FIG. 1.

FIG. 1 is a plan view showing the physical quantity sensor according to the first embodiment of the invention. FIG. 2 is a cross-sectional view taken along the line A-A in FIG. 1. FIGS. 3 and 4 are perspective cross-sectional views of a drive spring. FIG. 5 is a perspective view of the drive spring provided in the physical quantity sensor shown in FIG. 1. FIG. 6 is a cross-sectional view taken along the line B-B in FIG. 5. FIG. 7 is a cross-sectional view showing that a plurality of spring structures that form the drive spring are integrated with one another into a single spring structure. FIGS. 8 and 9 are each a plan view showing a variation of the drive spring shown in FIG. 5. FIG. 10 is a flowchart showing the steps of manufacturing the physical quantity sensor shown in FIG. 1. FIGS. 11 to 13 are cross-sectional views for describing a method for manufacturing the physical quantity sensor shown in FIG. 1. FIG. 14 is a schematic configuration diagram of an etcher. FIGS. 15 and 16 are cross-sectional views for describing the method for manufacturing the physical quantity sensor shown in FIG. 1.

In the following description, the side toward the reader with respect to the plane of view of FIG. 1 and the upper side in FIG. 2 is also called "upper," and the side away from the reader with respect to the plane of view of FIG. 1 and the lower side in FIG. 2 is also called "lower" for convenience of description. In the drawings, axes X, Y, and Z are shown as three axes perpendicular to one another. In the following description, the direction parallel to the axis X is also called an "X-axis direction," the direction parallel to the axis Y is also called an "Y-axis direction," and the direction parallel to the axis Z is also called an "Z-axis direction." The side facing the front end of the arrow of each of the axes is also called a "positive side," and the side opposite the positive side is also called a "negative side."

A physical quantity sensor 1 shown in FIGS. 1 and 2 is a gyro sensor capable of detecting angular velocity ωy around the axis Y. The physical quantity sensor 1 includes a substrate 2, a lid 3, and an element 4.

The substrate 2 is formed as a plate having a rectangular shape in a plan view, as shown in FIG. 1. The substrate 2 has a recess 21 that opens toward the upper surface of the substrate 2. In the plan view along the Z-axis direction, the recess 21 is formed so as to be greater than the element 4 and enclose the element 4. The thus configured recess 21 functions as a clearance for preventing (avoiding) contact between the element 4 and the substrate 2. The element 4 is bonded to the upper surface of the thus configured substrate 2.

The substrate 2 has grooves 22, 23, 24, 25, 26, 27, and 28, which each open toward the upper surface of the substrate 2.

The thus configured substrate 2 can, for example, be a glass substrate made of a glass material containing an alkali metal ion (movable ion, such as Na⁺) (for example, borosilicate glass, such as Pyrex glass (registered trademark)). The substrate 2 and the element 4 can therefore be bonded to each other, for example, in an anode bonding process, as will be described later, whereby the substrate 2 and the element 4 can be securely bonded to each other. Further, since the substrate 2 can be a light transmissive substrate, the state of the element 4 can be visually recognized through the substrate 2 from the exterior of the physical quantity sensor 1.

The substrate 2 is, however, not particularly limited to the substrate described above and may, for example, be a silicon substrate or a ceramic substrate. In the case where a silicon substrate is used as the substrate 2, it is preferable from the viewpoint of preventing short circuit to use a high-resistance silicon substrate or a silicon substrate on which a silicon oxide film (insulative oxide) is formed, for example, in a thermal oxidation process.

Wiring lines 72, 73, 74, 75, 76, 77, and 78 are provided in the grooves 22, 23, 24, 25, 26, 27, and 28, respectively, as shown in FIG. 1. One end of each of the wiring lines 72, 73, 74, 75, 76, 77, and 78 is exposed at a position outside the lid 3 and functions as an electrode pad P for electrical connection with an external apparatus.

Four fixed detection electrodes 5 are provided on the bottom surface of the recess 21, and capacitance C is created between each of the fixed detection electrodes 5 and the element 4.

The material of which the wiring lines 72, 73, 74, 75, 76, 77, and 78 and the fixed detection electrodes 5 are made is not limited to a specific material and may, for example, be gold (Au), silver (Ag), platinum (Pt), palladium (Pd), iridium (Ir), copper (Cu), aluminum (Al), nickel (Ni), titanium (Ti), tungsten (W), or any other metallic material, an alloy containing any of the metallic materials, or ITO (indium tin Oxide), IZO (indium zinc oxide), ZnO, IGZO, or any other oxide-based transparent electrically conductive material. One of the materials described above or a combination of two or more thereof (laminate having two or more layers, for example) can be used to form the wiring lines and the fixed detection electrodes.

The lid 3 is formed as a plate having a rectangular shape in the plan view, as shown in FIG. 1. The lid 3 has a recess 31 that opens toward the lower surface of the lid 3 (the surface facing substrate 2), as shown in FIG. 2. The thus configured lid 3 is bonded to the upper surface of the substrate 2 so that the element 4 is accommodated in the recess 31. The lid 3 and the substrate 2 forms an accommodation space S, which is an internal space and accommodates the element 4.

The lid 3 has a communication hole 32, which allows the interior and exterior of the accommodation space S to communicate with each other, as shown in FIG. 2. The atmosphere of the accommodation space S can be replaced with a desired atmosphere via the communication hole 32. A sealing member 33 is disposed in the communication hole 32 and hermetically closes the communication hole 32. The pressure in the accommodation space S is preferably lowered (preferably to a pressure lower than or equal to about 10 Pa). As a result, the viscous resistance decreases, whereby the element 4 is allowed to efficiently vibrate (be driven).

The sealing member 33 does not necessarily need to be made of a specific material and can be made of any material that can close the communication hole 32, for example, an alloy based on gold (Au) and tin (Sn), an alloy based on gold (Au) and germanium (Ge), an alloy based on gold (Au) and aluminum (Al), or any of a variety of other alloys, or a low-melting glass or any other glass material.

The thus configured lid 3 can, for example, be a silicon substrate. The lid 3, however, is not limited to a silicon substrate and may instead be a glass substrate or a ceramic substrate. The method for bonding the substrate 2 and the lid 3 to each other is not limited to a specific method and may be selected as desired in accordance with the materials of the substrate 2 and the lid 3. Examples of the bonding method may include anode bonding, activated bonding in which bonding surfaces activated by plasma irradiation are bonded to each other, bonding using glass frit or any other bonding material, and diffusion bonding in which metal films deposited on the upper surface of the substrate 2 and the lower surface of the lid 3 are bonded to each other.

In the present embodiment, the substrate 2 and the lid 3 are bonded to each other via glass frit 39 (low-melting glass), which is an example of the bonding material, as shown in FIG. 2. In the state in which the substrate 2 and the lid 3 are layered on each other, the interior and exterior of the accommodation space S undesirably communicate with each other via the grooves 22, 23, 24, 25, 26, 27, and 28, but use of the glass frit 39 allows not only the substrate 2 and the lid 3 to be bonded to each other but the grooves 22, 23, 24, 25, 26, 27, and 28 to be closed. The accommodation space S can therefore be more readily hermetically sealed. In the case where the substrate 2 and the lid 3 are bonded to each other, for example, in an anode bonding process (bonding method that cannot close grooves 22, 23, 24, 25, 26, 27, and 28), the grooves 22, 23, 24, 25, 26, 27, and 28 can be closed with an $SiO_2$ film formed, for example, by using a TEOS-based (tetraethoxysilane-based) CVD method.

The element 4 is disposed in the accommodation space S and bonded to the upper surface of the substrate 2, as shown in FIG. 1. The element 4 includes two structures 40 (40a and 40b) and a linkage spring 401, which links the structures 40a and 40b to each other. The thus configured element 4 can be monolithically formed, for example, by using a dry etching method (Bosch method, in particular) for patterning an electrically conductive silicon substrate into which phosphor, boron, or any other impurity is doped.

The two structures 40a and 40b are provided side by side in the X-axis direction and are symmetrical with respect to an imaginary straight line α along the axis Y. The linkage spring 401 is provided between the structures 40a and 40b and links driven sections 41, which are provided in the structures 40a and 40b and will be described later, to each other.

The structures 40 each include the driven section 41, drive springs 42, fixers 43 (anchors), movable drive electrodes 44, fixed drive electrode 45 and 46, a detection flap plate 47, a spring structure 48, and drive monitor electrodes 49. The detection flap plate 47 includes a first flap plate 471 and a second flap plate 472, and the spring structure 48 includes a first spring structure 481 and a second spring structure 482.

The driven sections 41 are each a rectangular frame. One-side end (an anchor end) of each of the drive springs 42 is respectively connected to the four corners of the driven sections 41. The drive springs 42 have elasticity in the X-axis direction and support the driven sections 41 so that the driven sections 41 are displaceable in the X-axis direction. The thus configured drive springs 42 each have a serpentine shape and extend in the X-axis direction while extendedly meandering back and forth in the Y-axis direction. The other-side end (a frame end) of each of the drive springs 42 is connected to the fixers 43, and the fixers 43 are bonded to the upper surface of the substrate 2.

The driven sections 41 and the drive springs 42 are therefore supported so as to float above (be spaced apart from) the substrate 2. The method for bonding the fixers 43 to the substrate 2 is not limited to a specific method and can, for example, be anode bonding. At least one of the plurality of fixers 43 is electrically connected to the wiring line 78 via an electrically conductive bump (not shown).

The movable drive electrodes 44 are provided as part of each of the driven sections 41 and four of them are formed in total with two on the Y-axis-direction positive side of the driven sections 41 and two on the Y-axis-direction negative side thereof in the present embodiment. The movable drive electrodes 44 each have a comb-tooth-like shape having a support extending from the driven section 41 in the Y-axis direction and a plurality of electrode fingers extending from the support toward opposite sides in the X-axis direction. The arrangement or number of the movable drive electrodes 44 is not limited to a specific arrangement or a specific number.

The fixed drive electrodes 45 and 46 are bonded (fixed) to the substrate 2. One movable drive electrode 44 is located between one set of fixed drive electrodes 45 and 46. The fixed drive electrodes 45 and 46 each have a comb-tooth-like shape having a support extending in the Y-axis direction and a plurality of electrode fingers extending from the support toward one side in the X-axis direction (side facing movable drive electrode 44).

The fixed drive electrodes 45 are each electrically connected to the wiring line 75 via an electrically conductive bump B (see FIG. 2), and the fixed drive electrodes 46 are each electrically connected to the wiring line 74 via an electrically conductive bump (not shown).

In the configuration described above, a drive voltage is applied to the space between the movable drive electrodes 44 and the fixed drive electrodes 45, 46 to alternately create a state in which electrostatic attraction occurs between the movable drive electrodes 44 and the fixed drive electrodes 45 and a state in which electrostatic attraction occurs between the movable drive electrodes 44 and the fixed drive electrodes 46, whereby the driven sections 41 can vibrate in the X-axis direction with the drive springs 42 expanding and contracting (elastically deforming) in the X-axis direction. In the following description, the vibration mode described above is also referred to as a "drive vibration mode." The fixed drive electrodes 45 and 46 in the structure 40a and the fixed drive electrodes 45 and 46 in the structure 40b are symmetrically arranged. The two driven sections 41 therefore vibrate in opposite phases in the X-axis direction so that they approach each other and move away from each other. The vibration of the two driven sections 41 can therefore be canceled out, whereby leakage of the vibration can be reduced.

The present embodiment employs the method for causing the driven sections 41 to vibrate in the X-axis direction based on electrostatic attraction (electrostatic drive method), as described above, but the method for causing the driven sections 41 in the X-axis direction is not particularly limited to the method described above and may instead be a piezoelectric drive method, an electromagnetic drive method using Lorentz force in a magnetic field, or any other method.

The drive monitor electrodes 49 are each a pair of electrodes, a movable monitor electrode 491 and a fixed monitor electrode 492, between which capacitance is created. The movable monitor electrodes 491 are provided as part of each of the driven sections 41 and four of them are formed in total with two on the X-axis-direction positive side of the driven section 41 and two on the X-axis-direction negative side thereof in the present embodiment. The movable monitor electrodes 491 each have a comb-tooth-like shape having a support extending from the driven section 41 in the Y-axis direction and a plurality of electrode fingers extending from the support toward one side in the X-axis direction (side facing fixed monitor electrode 492). On the other hand, the fixed monitor electrodes 492 are fixed (bonded) to the substrate 2 and formed of a plurality of electrodes that face the movable monitor electrodes 491. The fixed monitor electrodes 492 each have a comb-tooth-like shape having a support extending in the Y-axis direction and a plurality of electrode fingers extending from the support toward one side in the X-axis direction (side facing movable monitor electrode 491).

Out of the four movable monitor electrodes 491 provided in the structure 40a, the two movable monitor electrodes 491 located on the positive side in the X-axis direction are electrically connected to the wiring line 73 via electrically conductive bumps (not shown), and the two movable monitor electrodes 491 located on the negative side in the X-axis direction are electrically connected to the wiring line 72 via electrically conductive bumps (not shown). Similarly, out of the four movable monitor electrodes 491 provided in the structure 40b, the two movable monitor electrodes 491 located on the negative side in the X-axis direction are electrically connected to the wiring line 73 via electrically conductive bumps (not shown), and the two movable monitor electrodes 491 located on the positive side in the X-axis direction are electrically connected to the wiring line 72 via electrically conductive bumps (not shown).

When the structures 40 are caused to vibrate in the drive vibration mode, as described above, the displacement of the driven sections 41 in the X-axis direction changes the gaps between the movable monitor electrodes 491 and the fixed monitor electrodes 492, and the capacitance between the movable monitor electrodes 491 and the fixed monitor electrodes 492 changes accordingly. The state of the vibration of the driven sections 41 can therefore monitored based on the change in the capacitance.

The first and second flap plates 471, 472 are located inside each of the driven sections 41 and arranged side by side in the Y-axis direction. The first and second flap plates 471, 472 each have a rectangular-plate-like shape. The first flap plate 471 is linked to the driven section 41 via the first spring structure 481, and the second flap plate 472 is linked to the driven section 41 via the second spring structure 482. When the angular velocity ωy around the axis Y acts on the physical quantity sensor 1 in the state in which the driven sections 41 are driven in the drive vibration mode, the first and second flap plates 471, 472 pivot (are displaced) around pivotal axes J1 and J2, which are formed by the first and second spring structures 481, 482, with the first and second spring structures 481, 482 twisted (elastically deformed) by a Coriolis force. In the following description, the vibration mode described above is also referred to as a "detection vibration mode."

The first and second flap plates 471, 472 do not necessarily have specific orientations and may, for example, be disposed so that the free ends thereof face each other or disposed so that the free ends thereof face the same side. One of the first and second flap plates 471, 472 may be omitted.

The fixed detection electrodes 5 are provided in regions of the substrate 2 that face the first and second flap plates 471, 472 (regions that coincide with first and second flap plates 471, 472 in plan view viewed in Z-axis direction), and capacitance C is created between each of the first flap plates 471 and the corresponding fixed detection electrode 5 and between each of the second flap plates 472 and the corresponding fixed detection electrode 5, as shown in FIG. 2.

The two fixed detection electrodes 5 that face the structure 40a are electrically connected to the wiring line 77, and the two fixed detection electrodes 5 that face the structure 40b are electrically connected to the wiring line 76, as shown in FIG. 1.

The action of the physical quantity sensor 1 will be described next. A drive voltage is first applied to the space between the movable drive electrodes 44 and the fixed drive electrodes 45, 46 to cause the driven sections 41 to vibrate in the drive vibration mode. In this state, when the angular velocity ωy acts on the physical quantity sensor 1, a Coriolis force acts on the physical quantity sensor 1 so that the detection vibration mode is activated, and the first and second flap plates 471, 472 pivot around the pivotal axes J1 and J2. The gaps between the first and second flap plates 471, 472 and the fixed detection electrodes 5 therefore change, and the capacitance C changes accordingly. The angular velocity ωy can therefore be determined by detection of the amount of change in the capacitance C (difference signal).

In the drive vibration mode, ideally, it is preferable that the driven sections 41 translate in the X-axis direction. That is, in the drive vibration mode, it is preferable that the driven sections 41 are not displaced in the Z-axis direction. The reason for this is that displacement of the driven sections 41 in the Z-axis direction not only changes the gaps between the first and second flap plates 471, 472 and the fixed detection electrodes 5 but causes the first and second flap plates 471, 472 to pivot around the pivotal axes J1 and J2 in response to the displacement of the driven sections 41 in the Z-axis direction, so that the capacitance C undesirably changes although no angular velocity ωy acts on the physical quantity sensor 1. A quadrature signal (noise) is therefore created and degrades the accuracy in the detection of the angular velocity ωy. In the following description, vibration of the driven sections 41 in directions other than the X-axis direction (vibration in Z-axis direction, in particular) in the drive vibration mode is also referred to as quadrature.

To suppress the quadrature, it is preferable to design the drive springs 42 to not have a vibration component in the Z-axis direction. Specifically, for example, it is preferable to design the drive springs 42 to have a rectangular lateral cross-sectional shape (oblong lateral cross-sectional shape elongated in Z-axis direction, in particular). In this case, the drive springs 42 have substantially no vibration component in the Z-axis direction, and the vibration direction F is parallel to the axis X, whereby the quadrature can be suppressed. However, the shape of the element 4 deviates in some cases from the rectangular shape due to processing errors, the characteristics of a processing apparatus, and other factors, so that the drive springs 42 have, for example, a parallelogrammatic lateral cross-sectional shape inclining with respect to the rectangular shape, as shown in FIG. 4. When the lateral cross-sectional shape of the drive springs 42 deviates from the rectangular shape (asymmetric with respect to axis Z), as described above, the drive springs 42 undesirably have a vibration component in the Z-axis direction as well as the vibration component in the X-axis direction, so that the vibration direction F' inclines with respect to the axis X and the quadrature is likely to occur.

The problem described above is solved in the physical quantity sensor 1 according to the present embodiment by skillfully shaping the drive springs 42 so that the quadrature in the drive vibration mode is suppressed. The drive springs 42 will be described below in detail. In the present embodiment, in which the plurality of drive springs 42 have the same configuration, one of the drive springs 42 (drive spring 42' in FIG. 1) will be representatively described, and the other drive springs 42 will not be described.

The drive springs 42 each have a serpentine shape and meander in the X-axis direction (direction perpendicular to detection axis) side by side while extending or projecting back and forth in the Y-axis direction (direction of detection axis), as shown in FIG. 5. The drive springs 42 therefore each have four (multiple) span spring structures 421 extending in the Y-axis direction and intermittently arranged along the X-axis direction, a connector structure 422 that connects a spring structure 421A to a spring structure 421B, a connector structure 422 that connects the spring structure 421B to a spring structure 421C, and a connector structure 422 that connects the spring structure 421C to a spring structure 421D.

The connector structures 422, which each serve as a folding section (a return), thus connect the same-one-side ends of adjacent spring structures 421 to each other. Each pair of spring structures 421A-D interconnected by a connector structure 422 forms one meander of the drive spring 42.

The spring structures 421 viewed in the Y-axis direction each have an elongated, roughly parallelogrammatic lateral cross-sectional shape, and the major axis L of the lateral cross-sectional shape inclines with respect to the axis Z, as shown in FIG. 6. The spring structures 421 incline toward the same side in the X-axis direction. The number of spring structures 421 is not limited to four and only needs to be at least two. The spring structures 421 may each have, for example, a roughly parallelogrammatic lateral cross-sectional shape already in the design stage or may have a rectangular lateral cross-sectional shape in the design stage but change, for example, to a roughly parallelogrammatic or trapezoidal shape, a barrel-like shape having a width between the side surfaces greater than the lengths of the upper and lower surfaces, or a pincushion-like shape having a width between the side surfaces smaller than the lengths of the upper and lower surfaces due, for example, to processing errors and the characteristics of a processing apparatus described above.

At least one of the four spring structures 421, the spring structures 421A and 421B in the present embodiment, is provided with a thin section 429 (is recessed), which has a thickness T (length in Z-axis direction, or height) smaller than that of the other spring structures 421. The thin section 429 is formed by providing the upper surface (principal surface opposite substrate 2) of the spring structure 421 with a recess 428 (cutout). Providing part of the four spring structures 421 with the thin section 429 allows reduction in the Z-axis-direction vibration component of the drive spring 42. The quadrature can be reduced as compared with a configuration in which no thin section 429 is provided.

Specifically, providing at least one of the spring structures 421A and 421B, which are located on the front end side (front end side beyond center) (anchor end) in the inclining direction of the major axis L (positive side in X-axis direction), with the thin section 429 allows reduction in the Z-axis-direction vibration component of the drive spring 42. Conversely, providing at least one of the spring structures 421C and 421D, which are located on the base end side (base end side beyond center) (frame end) in the inclining direction of the major axis L, with the thin section 429 allows increase in the Z-axis-direction vibration component of the drive spring 42. The phrase "the inclining direction of the major axis L" means in the present embodiment the direction in which the upper end of the major axis L shifts from the lower end thereof in FIGS. 5 and 6, that is, the X-axis direction. Further, the phrase "the front end side in the inclining direction of the major axis L" means in the present embodiment the left side (positive side in X-axis direction) in FIGS. 5 and 6, and the phrase "the base end side in the inclining direction of the major axis L" means in the present embodiment the right side (negative side in X-axis direction) in FIGS. 5 and 6 (the same holds true in the following description).

The reason why the Z-axis-direction vibration component of the drive spring 42 can be reduced and increased is believed to be the same reason why, considering the four spring structures 421 to be a unitary spring structure as shown in FIG. 7, removing an acute-angle portion out of the corners of the parallelogram allows reduction in the Z-axis-direction vibration component of the drive spring 42, whereas removing an obtuse-angle portion out of the corners of the parallelogram allows increase in the Z-axis-direction vibration component of the drive spring 42.

In view of the discussion described above, in the present embodiment, the spring structures 421A and 421B, which are located on the front end side in the inclining direction of the major axis L (positive side in X-axis direction), are each provided with the thin section 429 for reduction in the Z-axis-direction vibration component of the drive spring 42 and hence in the quadrature. The arrangement of the thin sections 429 is not particularly limited to the arrangement described above as long as the Z-axis-direction vibration component of the drive spring 42 can be reduced. For example, only the spring structure 421A or the spring structure 421B may be provided with the thin section 429.

As described above, the arrangement of the thin section 429 is not limited to a specific arrangement as long as the Z-axis-direction vibration component of the drive spring 42 can be reduced, but it is preferable that at least the spring structure 421A, which is located on the forefront end side in the inclining direction of the major axis L (positive side in X-axis direction), is provided with the thin section 429. The reason for this is that a greater amount of reduction in the Z-axis-direction vibration component of the drive spring 42 is achieved by providing a spring structure 421 closer to the front end side in the inclining direction of the major axis L with the thin section 429. That is, providing the spring structure 421A with the thin section 429 allows a greater amount of reduction in the Z-axis-direction vibration component than providing the spring structure 421B with the thin section 429. Providing the spring structure 421A, which is located on the forefront end side with the thin section 429, therefore allows effective reduction in the Z-axis-direction vibration component of the drive spring 42.

In the present embodiment, the thin section 429 provided in the spring structure 421A is provided over roughly the entire region where the spring structure 421A extends, but the region where the thin section 429 is formed is not particularly limited to the region described above. For example, part of the region in the direction in which the spring structure 421A extends may be provided with the thin section 429, as shown in FIG. 8, or the spring structure 421A may be intermittently provided with a plurality of thin sections 429, as shown in FIG. 9. Although not shown, the same holds true for the case where the spring structure 421B is provided with the thin section 429. Since the longer the region where the thin section 429 is formed (length in Y-axis direction), the greater the reduction in the Z-axis-direction vibration component of the drive spring 42, the region where the thin section 429 is formed may be adjusted in accordance with the magnitude of the Z-axis-direction vibration component of the drive spring 42.

In the present embodiment, the spring structure 421B, which is located in a position adjacent to the spring structure 421A (adjacent on negative side in X-axis direction), is also provided with the thin section 429, as described above. The following effects can therefore be provided. As a first effect, the Z-axis-direction vibration component of the drive spring 42 can be further reduced. For example, in a case where forming the thin section 429 over the entire region of the spring structure 421A does not allow sufficient reduction in the Z-axis-direction vibration component of the drive spring 42, providing the spring structure 421B adjacent to the spring structure 421A with the thin section 429 allows further reduction in (preferably allows elimination of) the Z-axis-direction vibration component of the drive spring 42.

As a second effect, fine adjustment of the Z-axis-direction vibration component of the drive spring 42 can be performed. A greater amount of reduction in the Z-axis-direction vibration component of the drive spring 42 is achieved by providing a spring structure 421 located in a position closer to the front end side in the inclining direction of the major axis L with the thin section 429, as described above. In view of the fact described above, providing the spring structure 421A with the thin section 429 allows coarse adjustment of the Z-axis-direction vibration component, and providing the spring structure 421B with the thin section 429 allows fine adjustment of the Z-axis-direction vibration component. As a result, the Z-axis-direction vibration component of the drive spring 42 can be reduced with further accuracy.

In the case where the drive spring 42 is provided with a plurality of thin sections 429, as in the present embodiment, it is preferable that the thin sections 429 have the same thickness T (or depth of recess 428). In this case, the plurality of thin sections 429 can be formed in the same step, as will be described later in the paragraph for a method for manufacturing the physical quantity sensor 1, whereby the number of steps of manufacturing the physical quantity sensor 1 can be reduced. The physical quantity sensor 1 can therefore be manufactured in a shorter period at lower cost. The term "the same thickness T" described above is not limited to exactly the same thickness T but includes, for example, a thickness T containing an inevitable manufacture error.

The thickness T of the thin section 429 is not limited to a specific value but is preferably greater than or equal to $5/10$ of the thickness of the other portion of the drive spring 42 but smaller than or equal to $9/10$ thereof. The smaller the thickness T of the thin section 429, the greater the amount of reduction in the Z-axis-direction vibration component of the drive spring 42, whereby the Z-axis-direction vibration component of the drive spring 42 can be effectively reduced, and an excessive decrease in the mechanical strength of the thin sections 429 can be avoided.

The thin section 429 is preferably provided symmetrically with respect to the center axis L1 of the drive spring 42. The symmetry of the drive spring 42 with respect to the center axis L1 can therefore be maintained. Occurrence of the vibration component, for example, in the Y-axis direction and an increase thereof can therefore be avoided, whereby the drive spring 42 can be more smoothly elastically deformed in the X-axis direction.

Further, the width W of each of the spring structures 421 in the X-axis direction (length in direction perpendicular to direction in which spring structure 421 extends) is smaller than the distance D by which a pair of adjacent spring structures 421 are separate from each other, as shown in FIG. 5. As a result, spring structures 421 adjacent to each other are sufficiently separate from each other. Therefore, for example, when the recess 428 (thin section 429) is formed in a certain spring structure 421, the possibility of damage of an adjacent spring structure 421 can be lowered.

The description has been made with reference to one drive spring 42 (42') as a representative of the drive springs 42. In the physical quantity sensor according to the present embodiment, eight drive springs 42 (four in each of structures 40a and 40b) are provided. The thin sections 429 may be formed in the drive springs 42 so that the Z-axis-direction vibration component is reduced to a sufficiently small value (preferably zero). That is, the shapes of the thin sections 429 differ from one another among the plurality of drive springs 42 in some cases or are equal to one another in other cases. Further, the thin section 429 may not be formed in the drive spring 42 not having the Z-axis-direction vibration component. Further, for example, in the case of the drive spring 42 shown in FIG. 5, the connector structure 422 that connects the spring structures 421A and 421B, which both have the thin sections 429, to each other, may be as thin as the spring structures 421A and 421B. That is, the thin section 429 may also be formed in the connector structure 422 that connects the spring structures 421A and 421B to each other. Further, the thin section 429 may be formed in any of the other connector structures 422.

The thin sections 429 formed in a plurality of the drive springs 42 all preferably have the same thickness T. As a result, the plurality of thin sections 429 can be formed in the same step, as will be described later in the paragraph for a method for manufacturing the physical quantity sensor 1, whereby the number of steps of manufacturing the physical quantity sensor 1 can be reduced.

The physical quantity sensor 1 has been described above. The physical quantity sensor 1 includes the driven sections 41 and the drive springs 42, which support the driven sections 41 so that the driven sections 41 are displaceable in the X-axis direction (first direction), and the drive springs 42 each have a serpentine shape and include the plurality of (span) spring structures 421, which extend in the Y-axis direction (second direction) that intersects the X-axis direction. At least one of the plurality of spring structures 421 (spring structures 421A and 421B in present embodiment) has the thin section 429, which is thinner in the Z-axis direction (third direction that intersects X-axis and Y-axis directions) than the other portions of the drive spring 42. Providing the thin section 429 as described above allows reduction in the Z-axis-direction vibration component and suppression of displacement of each of the driven sections 41 in a direction other than the X-axis direction. That is, the quadrature of the driven sections 41 can be suppressed. The physical quantity sensor 1 therefore has an excellent physical quantity detection characteristic.

The plurality of spring structures 421 may all be provided with the thin sections 429.

The drive springs 42 each have the recess 428, which opens toward the drive spring principal surface on one side in the Z-axis direction (side opposite substrate 2), and the portion above which the recess 428 is formed (portion located below recess 428) forms the thin section 429, as described above. The thin section 429 can therefore be readily formed, as will be described later in the description for a method for manufacturing the physical quantity sensor 1.

The plurality of spring structures 421 each have an elongated cross-sectional shape when viewed in the Y-axis direction (second direction) and have a portion where the major axis L of the elongated shape inclines with respect to the Z-axis direction, as described above. The cross-sectional shape is a shape that tends to be formed due to processing errors, the characteristics of a processing apparatus, and other factors. Since the drive spring 42 having the cross-sectional shape tends to have a Z-axis-direction vibration component, the effect described above is provided in a more noticeable manner.

Out of the plurality of spring structures 421, at least the spring structure 421A, which is located on the forefront end side in the direction in which the major axis inclines with respect to the Z-axis direction, is provided with the thin section 429, as described above. The Z-axis-direction vibration component of the drive spring 42 can therefore be effectively reduced, whereby the quadrature can be suppressed.

The drive springs 42 each include a plurality of thin sections 429, and the plurality of thin sections 429 are separately provided in at least two spring structures 421 (spring structure 421A and adjacent spring structure 421B in present embodiment), as described above. As a result, in the case where forming the thin section 429 in the spring structure 421A does not allow sufficient reduction in the Z-axis-direction vibration component of the drive spring 42, the Z-axis-direction vibration component of the drive spring can be more effectively reduced, as described above. Further, since the amounts of reduction in the Z-axis-direction vibration component of the drive spring 42 per unit length of the thin section 429 differ from one another among the plurality of spring structures 421, separately providing the plurality of spring structures 421 with the thin sections 429 allows coarse and fine adjustments of the Z-axis-direction vibration component of the drive spring 42. The Z-axis-direction vibration component of the drive spring 42 can therefore be reduced with increased accuracy.

The plurality of thin sections 429 have the same thickness T, as described above. The plurality of thin sections 429 can therefore be formed in the same step, as will be described later in the description for a method for manufacturing the physical quantity sensor 1. The number of steps of manufacturing the physical quantity sensor 1 can therefore be reduced. The physical quantity sensor 1 can therefore be manufactured in a shorter period at lower cost.

The width W of each of the spring structures 421 in the X-axis direction (length in direction perpendicular to direction in which spring structure 421 extends) is smaller than the distance D by which a pair of adjacent spring structures 421 are separate from each other, as described above. As a result, spring structures 421 adjacent to each other are sufficiently separate from each other. Therefore, for example, when the thin section 429 is formed in a certain spring structure 421, the possibility of damage of an adjacent spring structure 421 can be effectively lowered.

A method for manufacturing the physical quantity sensor 1 will be described next. The method for manufacturing the physical quantity sensor 1 includes a substrate preparation step of preparing the substrate 2, an element formation step of forming the element 4 on the substrate 2, a thin section formation step of forming the thin section 429 in each of the drive springs 42, a lid bonding section of bonding the lid 3 to the substrate 2, and a dicing step, as shown in FIG. 10.

Substrate Preparation Step

A glass substrate 20, which has a plurality of regions S2, which will each form the substrate 2, is first prepared, and the recess 21 and the grooves 22, 23, 24, 25, 26, 27, and 28 are formed in each of the regions S2, as shown in FIG. 11. The recess 21 and the grooves 22, 23, 24, 25, 26, 27, and 28 can be formed, for example, by using a photolithography technique and a wet etching technique. The fixed detection electrodes 5 are then formed on the bottom surface of the recess 21, and the wiring lines 72, 73, 74, 75, 76, 77, and 78 in the grooves 22, 23, 24, 25, 26, 27, and 28 and the electrode pads P are formed.

Element Formation Step

A substrate 400 formed of a silicon substrate is then prepared and bonded onto the substrate 2 by using an anode bonding method, as shown in FIG. 12. The thickness of the substrate 400 is then reduced, for example, by using CMP (chemical mechanical polishing) so that the thickness of the substrate 400 is equal to the thickness of the element 4. Phosphor, boron, or any other impurity is then doped into the substrate 400 to impart electrical conductivity to the substrate 400, and the substrate 400 is then patterned to produce the element 4, as shown in FIG. 13. The patterning method is not limited to a specific method, and it is preferable to use a dry Bosch method, which is the combination of an etching process using a reactive plasma gas and a deposition process. A high-aspect-ratio through hole can therefore be formed, whereby the element 4 can be patterned with increased precision and minuteness.

A dry etcher used to pattern the substrate 400 will now be briefly described. An etcher 900 includes a stage electrode 910 and a counter electrode 920, which is provided so as to face the stage electrode 910, and the two electrodes are disposed in a chamber 930, as shown in FIG. 14. In the thus configured etcher 900, a wafer Q (laminate of glass substrate 20 and substrate 400) is placed on the stage electrode 910, and an etching gas is caused to flow in the chamber 930 in a vacuum state to achieve a plasma environment. In this state, a reaction gas G is accelerated between the stage electrode 910 and the counter electrode 920 to collide with the wafer Q. The substrate 400 of the wafer Q can thus be processed. In this process, in a position closer to the outer edge of the wafer Q, the substrate 400 tends to be more obliquely processed because the reaction gas G radially moves (accelerates) from a central portion of the chamber 930 due, for example, to the influence of the plasma distribution. Therefore, in an element 4 located in a position closer to the outer edge of the wafer Q, the drive springs 42 are obliquely processed, and the inherent Z-axis-direction vibration component therefore tends to increase.

Thin Section Formation Step

The Z-axis-direction vibration component of each of the drive springs 42 is then detected for each of the elements 4. A method for detecting the Z-axis-direction vibration component is not limited to a specific method. For example, the elements 4 are each driven in the drive vibration mode on the substrate 400 with inspection probe pins pressed against the electrode pads P, and the Z-axis-direction vibration component of each of the drive springs 42 can be detected based on a detected signal (change in capacitance C).

In the case of the gyro sensor described in JP-T-2002-540406, JP-T-2002-540406 proposes to reduce a Y-axis-direction vibration, such as that described above, by irradiating a surface of the spring structure is irradiated with laser light so that the surface undergoes laser ablation (removal) or depositing a material on the spring structure.

To irradiate the spring structure with laser light, however, high-precision alignment is necessary, or it is difficult to simultaneously process the spring structure at a plurality of locations with the laser light or deposit the material on the spring structure, undesirably resulting in poor productivity (efficiency).

A drive spring 42 in which the thin section 429 (recess 428) is formed and the position in which the thin section 429 (recess 428) is formed are then determined based on the result of the detection described above for each of the elements 4, and the thin section 429 (recess 428) is formed in the drive spring 42 according to the result of the determination. A method for forming the thin section 429 (recess 428) is not limited to a specific method, and it is preferable to form the thin section 429 (recess 428), for example, by using dry etching. In dry etching, in which a mask is used, the thin section 429 can be formed with increased precision and minuteness. In each of the elements 4, the distance D by which a pair of adjacent spring structures 421 are separate from each other is greater than the width W of each of the spring structures 421, as described above. A shift of the mask in the X-axis direction can therefore be fully tolerated, whereby the thin section 429 can be formed with precision in a specified position even when the mask is shifted to some extent.

In the physical quantity sensor 1, since the recess 428 is formed in the upper surface (surface opposite substrate 2) of each of the drive springs 42, the dry etching described above allows the thin section 429 to be more readily formed than in other methods.

In the physical quantity sensor 1, in particular, the thin sections 429 all have the same thickness (depth of recess 428). The thin sections 429 can therefore be all formed in the same etching period. The thin sections 429 can therefore all be formed in the same step, whereby the number of manufacturing steps can be reduced. In other words, in the physical quantity sensor 1, since the Z-axis-direction vibration component of each of the drive springs 42 is reduced by setting the thin sections 429 at a fixed thickness and adjusting the length thereof, the Z-axis-direction vibration component of the drive spring 42 can be more reliably reduced in a smaller number of steps than in other methods, as described above.

The thin section formation step described above may be formed of the step of detecting the Z-axis-direction vibration component of the drive spring 42 and the step of forming the thin section 429 based on the result of the detection with the two steps repeated multiple times. As a result, the Z-axis-direction vibration component of the drive spring 42 can be reduced with increased precision.

The method for forming the thin section 429 is not limited to the dry etching described above and may instead, for example, be a processing method for irradiating a target spring structure 421 with an IB (ion spring structure) or any other energy line via a mask.

Lid Bonding Step

A substrate 30 including a plurality of lids 3 is then prepared, and the substrate 30 is bonded to the upper surface of the substrate 2 via the glass frit 39, as shown in FIG. 15. The atmosphere of the accommodation space S is replaced with a desired atmosphere, and then the communication hole 32 is closed with the sealing member 33. The accommodation space S is thus sealed.

Dicing Step

A dicing blade or any other tool is then used to cut the resultant structure into individual physical quantity sensors 1, as shown in FIG. 16. The physical quantity sensors 1 are thus provided.

The aforementioned method for manufacturing the physical quantity sensor 1 includes the element formation step of patterning the substrate 400 to form the elements 4, which each include the driven sections 41 and the drive springs 42, which support the driven sections 41 so that the driven sections 41 are displaceable in the X-axis direction (first direction), with the drive springs 42 each having a serpentine shape and including a plurality of spring structures 421, which extend in the Y-axis direction (second direction), which intersects the X-axis direction, and the thin section formation step of forming the thin section 429 in at least one of the plurality of spring structures 421 so that the thin section 429 is thinner in the Z-axis direction (third direction that intersects X-axis and Y-axis directions) than the other spring structures 421, as described above. Forming the thin section 429 in each of the drive springs 42 as described above allows reduction in the Z-axis-direction vibration component of the drive spring 42 and hence suppression of the quadrature. A physical quantity sensor 1 having an excellent physical quantity detection characteristic can therefore be provided.

Further, in the thin section formation step, the thin section 429 is formed by processing each of the drive springs 42 via a mask. The thin section 429 can therefore be formed with increased precision.

Second Embodiment

A physical quantity sensor according to a second embodiment of the invention will be described next.

Figure 17:
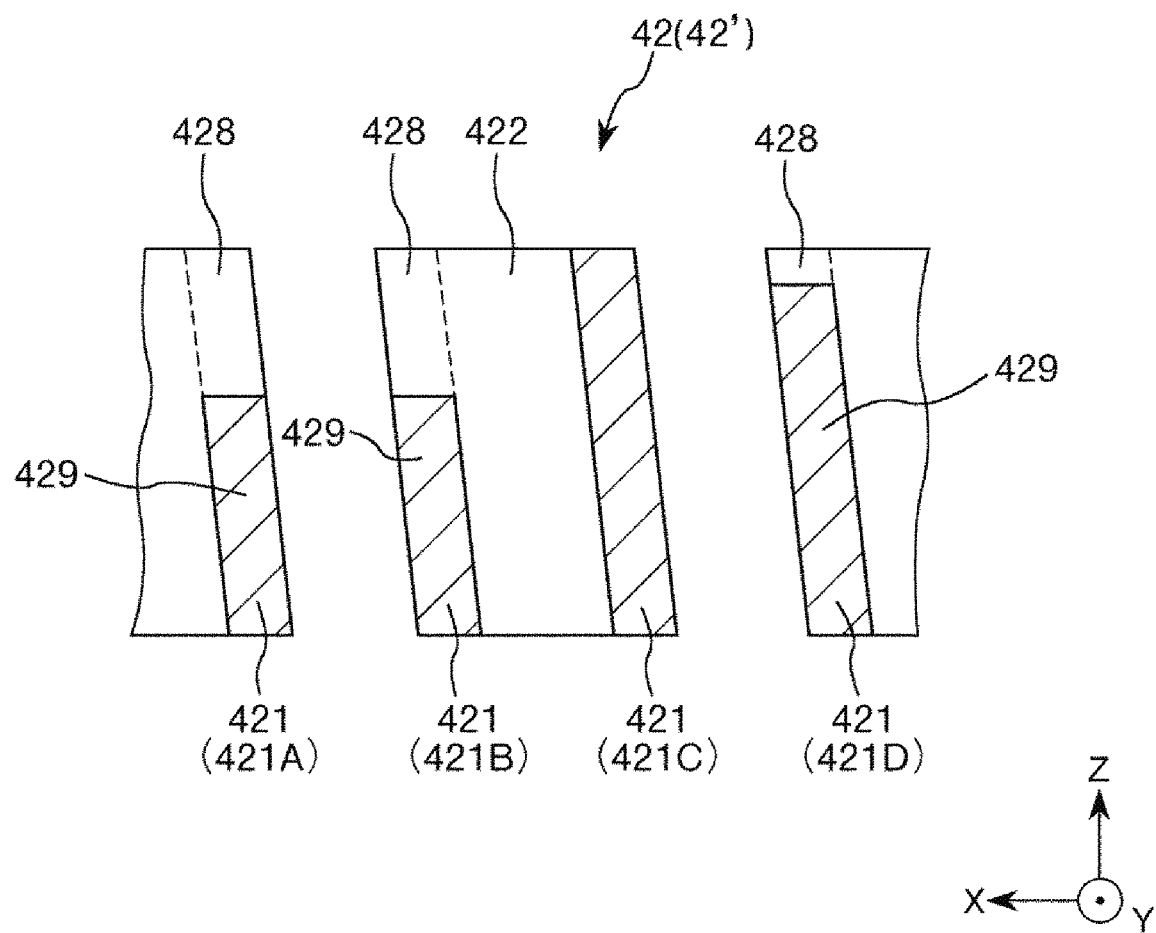
FIG. 17 is a cross-sectional view of a drive spring provided in a physical quantity sensor according to a second embodiment of the invention.

FIG. 17 is a cross-sectional view of a drive spring provided in the physical quantity sensor according to the second embodiment of the invention.

The physical quantity sensor according to the present embodiment is the same as the physical quantity sensor according to the first embodiment described above primarily except that the drive springs 42 are configured differently.

In the following description, the physical quantity sensor according to the second embodiment will be described primarily on the difference from the first embodiment described above, and the same items will not be described. Further, in FIG. 17, the same configurations as those in the first embodiment described above have the same reference characters.

In the present embodiment, out of the plurality of spring structures 421, at least one of the spring structures 421C and 421D (spring structure 421D in present embodiment), which are located on the base end side in the direction in which the major axis L inclines, is also provided with the thin section 429. The Z-axis-direction vibration component of the drive spring 42 can therefore be increased. Therefore, for example, in a case where too a large thin section 429 has been formed in the spring structures 421A and/or 421B, the thin section 429 can be formed in the spring structures 421C and/or 421D to cancel the excessive amount of the thin section 429 formed in the spring structures 421A and/or 421B, whereby the Z-axis-direction vibration component of the drive spring 42 can be more effectively reduced. In the present embodiment, the thin section 429 for cancellation is formed in the spring structure 421D, but not necessarily, as long as the Z-axis-direction vibration component is increased and may be formed, for example, in the adjacent spring structure 421C.

The second embodiment described above can also provide the same effects as those provided by the first embodiment described above.

Third Embodiment

A physical quantity sensor according to a third embodiment of the invention will be described next.

Figure 18:
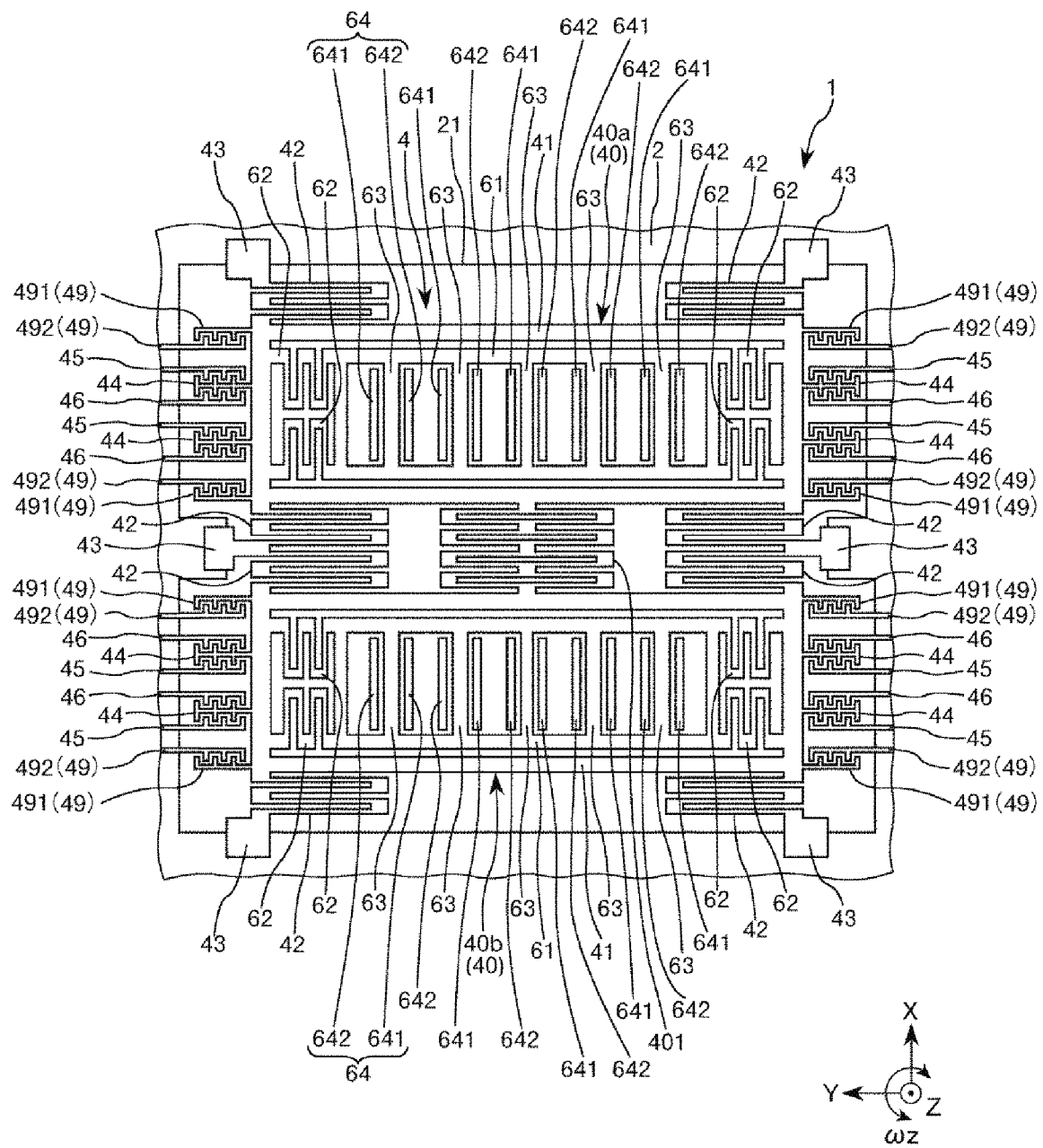
FIG. 18 is a plan view showing a physical quantity sensor according to a third embodiment of the invention.

FIG. 18 is a plan view showing the physical quantity sensor according to the third embodiment of the invention.

The physical quantity sensor according to the present embodiment is the same as the physical quantity sensor according to the first embodiment described above except that the configuration of the element and the detection axis differ from those in the first embodiment.

In the following description, the physical quantity sensor according to the third embodiment will be described primarily on the differences from the first embodiment described above, and the same items will not be described. Further, in FIG. 18, the same configurations as those in the first embodiment described above have the same reference characters.

The physical quantity sensor 1 according to the present embodiment is a gyro sensor capable of detecting the angular velocity ωz around the axis Z. The structures 40 (40a and 40b) each include the driven section 41, the drive springs 42, the fixers 43, the movable drive electrodes 44, the fixed drive electrodes 45 and 46, the drive monitor electrodes 49, a movable section 61, detection springs 62, movable detection electrodes 63, and fixed detection electrodes 64, as shown in FIG. 18. The driven sections 41, the drive springs 42, the fixers 43, the movable drive electrodes 44, the fixed drive electrodes 45 and 46, the drive monitor electrodes 49 are configured in the same manner as in the first embodiment described above, and the movable section 61, the detection springs 62, the movable detection electrodes 63, and the fixed detection electrodes 64 will therefore be described below.

The movable section 61 has a frame-like shape and is located inside each of the frame-shaped driven sections 41. The detection springs 62 link the driven section 41 and the movable section 61 to each other so that the movable section 61 is displaceable in the Y-axis direction relative to the driven section 41. The detection springs 62 are formed of four detection springs 62 provided in the driven section 41 and connected to the four corners of the driven section 61. The detection springs 62 can therefore support the movable section 61 in a more stable attitude. Further, the detection springs 62 have elasticity in the Y-axis direction and support the movable section 61 so that the movable section 61 is displaceable in the Y-axis direction. The thus configured detection springs 62 each have a serpentine shape and extend in the Y-axis direction with protruding back and forth in the X-axis direction. The arrangement or number of the detection springs 62 is not limited to a specific arrangement or a specific number.

The movable detection electrodes 63 are provided inside the movable section 61. The movable detection electrodes 63 extend in the X-axis direction, and the opposite ends of each of the movable detection electrodes 63 are connected to the movable section 61.

The fixed detection electrodes 64 each include a first fixed detection electrode 641 and a second fixed detection electrode 642. The first fixed detection electrodes 641 and the second fixed detection electrodes 642 are fixed to the substrate 2. Although not shown, the first fixed detection electrodes 641 are electrically connected to the wiring line 76, and the second fixed detection electrodes 642 are electrically connected to the wiring line 77.

The first fixed detection electrodes 641 in the structure 40a are disposed on the positive side in the Y-axis direction so as to face the movable detection electrodes 63, and the first fixed detection electrodes 641 in the structure 40b are disposed on the negative side in the Y-axis direction so as to face the movable detection electrodes 63. On the other hand, the second fixed detection electrodes 642 in the structure 40a are disposed on the negative side in the Y-axis direction so as to face the movable detection electrodes 63, and the second fixed detection electrodes 642 in the structure 40b are disposed on the positive side in the Y-axis direction so as to face the movable detection electrodes 63. Capacitance is created between the movable detection electrodes 63 and the first fixed detection electrodes 641 and between the movable detection electrodes 63 and the second fixed detection electrodes 642.

The thus configured physical quantity sensor 1 is an angular velocity sensor capable of detecting the angular velocity ωz around the axis Z. Specifically, when the angular velocity ωz acts on the physical quantity sensor 1 during the vibration of the driven sections 41 in the drive vibration mode, a Coriolis force acts on the physical quantity sensor 1 and causes the movable sections 61 to vibrate in the Y-axis direction relative to the driven sections 41 (detection vibration mode). As a result, the gaps between the movable detection electrodes 63 and the first fixed detection electrodes 641 change, so that the capacitance between the movable detection electrodes 63 and the first fixed detection electrodes 641 changes, and the gaps between the movable detection electrodes 63 and the second fixed detection electrodes 642 change, so that the capacitance between the movable detection electrodes 63 and the second fixed detection electrodes 642 changes. The angular velocity ωz can therefore be determined by detection of the amount of change in the capacitance.

In the present embodiment, in the detection vibration mode, ideally, it is preferable that the movable sections 61 translate in the Y-axis direction. That is, in the detection vibration mode, it is preferable that the movable sections 61 are not displaced in the Z-axis direction. The reason for this is that when the movable sections 61 are displaced in the Z-axis direction, the area over which the movable detection electrodes 63 face the first and second fixed detection electrodes 641, 642 changes, and the capacitance between the movable detection electrodes 63 and the first and second fixed detection electrodes 641, 642 undesirably changes accordingly. As a result, only a change in the capacitance based on a change in the gaps between the movable detection electrodes 63 and the first and second fixed detection electrodes 641, 642 (change in capacitance corresponding to angular velocity ωz) cannot be detected, and the accuracy in the detection of the angular velocity ωz could therefore decrease. To avoid the problem, the thin section may also be formed in each of the detection springs 62 to reduce the Z-axis-direction vibration component, as in the case of the drive springs 42 described above. The angular velocity ωz can thus be detected with increased accuracy.

The third embodiment described above can also provide the same effects as those provided by the first embodiment described above.

Fourth Embodiment

A physical quantity sensor according to a fourth embodiment of the invention will be described next.

Figure 19:
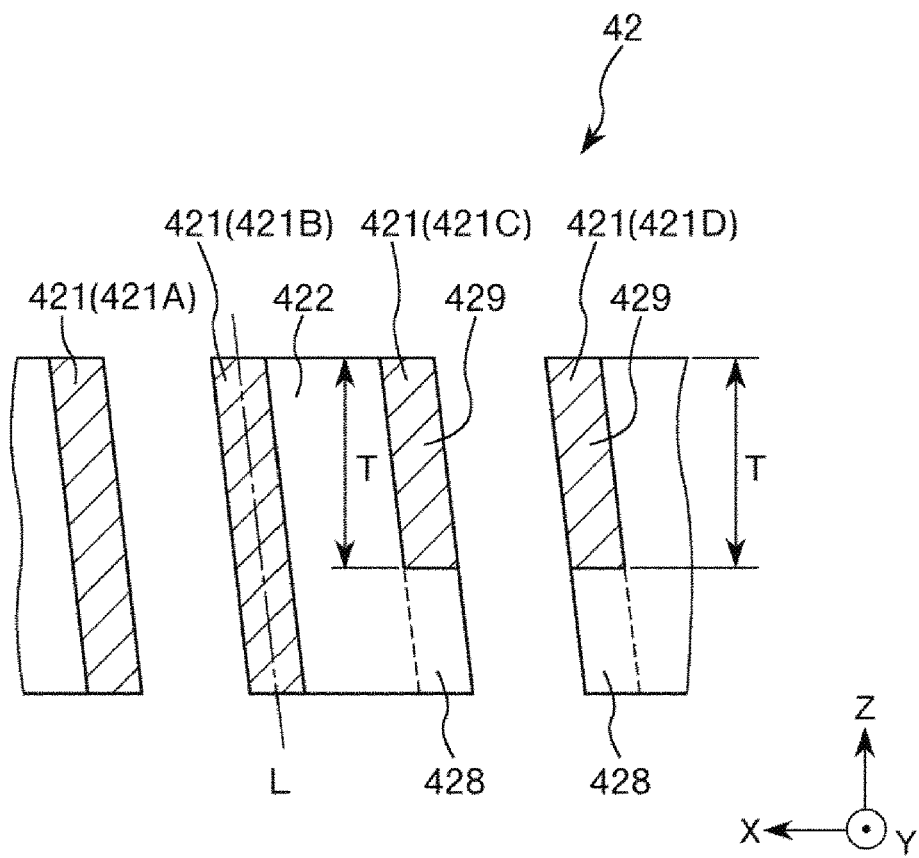
FIG. 19 is a cross-sectional view of a drive spring provided in a physical quantity sensor according to a fourth embodiment of the invention.

FIG. 19 is a cross-sectional view of a drive spring provided in the physical quantity sensor according to the fourth embodiment of the invention.

The physical quantity sensor according to the present embodiment is the same as the physical quantity sensor according to the first embodiment described above except that the element (drive springs, in particular) is configured differently.

In the following description, the physical quantity sensor according to the fourth embodiment will be described primarily on the difference from the first embodiment described above, and the same items will not be described. Further, in FIG. 19, the same configurations as those in the first embodiment described above have the same reference characters.

In each of the drive springs 42 in the present embodiment, out of the four spring structures 421, the spring structures 421C and 421D are each provided with the thin section 429 having a thickness T (length in Z-axis direction, or height (even though from top down in this instance)) smaller than that of the other spring structures, as shown in FIG. 19. The thin section 429 is formed by providing the lower surface of the spring structure 421 (principal surface facing substrate 2) with the recess 428 (cutout). Providing part of the four spring structures 421 with the thin section 429 as described above allows reduction in the Z-axis-direction vibration component of the drive spring 42. The quadrature can therefore be reduced as compared with a configuration in which no thin section 429 is provided. The arrangement of the thin section 429 is not particularly limited to the arrangement described above as long as the Z-axis-direction vibration component of the drive spring 42 can be reduced, and only the spring structure 421D or 421C may be provided with the thin section 429.

The arrangement of the thin section 429 is not limited to a specific arrangement as long as the Z-axis-direction vibration component of the drive spring 42 can be reduced, as described above, but it is preferable that the spring structure 421D, which is located on the forefront end side in the inclining direction of the major axis L, is provided with the thin section 429. The reason for this is that a greater amount of reduction in the Z-axis-direction vibration component of the drive spring 42 is achieved by providing a spring structure 421 closer to the front end side in the inclining direction of the major axis L with the thin section 429. The phrase "the inclining direction of the major axis L" means in the present embodiment the direction in which the upper end of the major axis L shifts from the lower end thereof in FIG. 19, that is, the negative side in the X-axis direction. Further, the phrase "the front end side in the inclining direction of the major axis L" means in the present embodiment the right side (negative side in X-axis direction) in FIG. 19.

The fourth embodiment described above can also provide the same effects as those provided by the first embodiment described above.

Fifth Embodiment

A physical quantity sensor according to a fifth embodiment of the invention will be described next.

Figure 20:
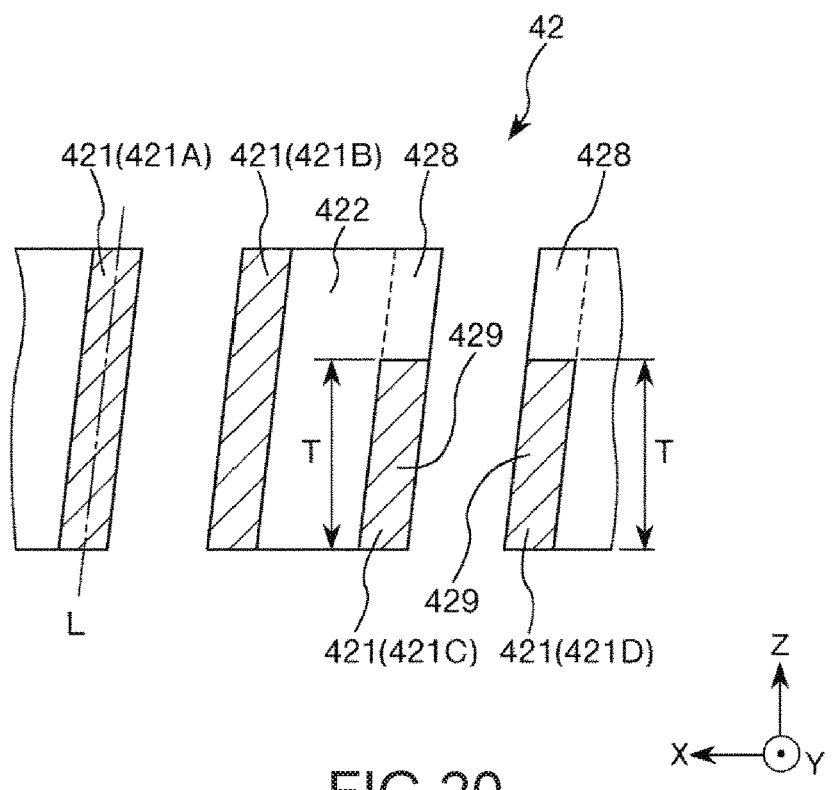
FIG. 20 is a cross-sectional view of a drive spring provided in a physical quantity sensor according to a fifth embodiment of the invention.

FIG. 20 is a cross-sectional view of a drive spring provided in the physical quantity sensor according to the fifth embodiment of the invention.

The physical quantity sensor according to the present embodiment is the same as the physical quantity sensor according to the first embodiment described above except that the element (drive springs, in particular) is configured differently.

In the following description, the physical quantity sensor according to the fifth embodiment will be described primarily on the difference from the first embodiment described above, and the same items will not be described. Further, in FIG. 20, the same configurations as those in the first embodiment described above have the same reference characters.

In each of the drive springs 42 in the present embodiment, the four spring structures 421 incline so that the upper ends thereof shift from the lower ends thereof toward the negative side in the X-axis direction, as shown in FIG. 20. That is, the inclining direction of the spring structures 421 is opposite the inclining direction in the first embodiment described above. In the present embodiment, the direction in which the upper end of the major axis L shifts from the lower end thereof, that is, the X-axis direction is also called "the inclining direction of the major axis L," and the negative side in the X-axis direction is also called "the front end side in the inclining direction of the major axis L."

Out of the four spring structures 421, the spring structures 421C and 421D, which are located on the front end side in the inclining direction of the major axis L, are each provided with the thin section 429 having a thickness T (length in Z-axis direction, or height) smaller than that of the other spring structures 421. The thin section 429 is formed by providing the upper surface (principal surface opposite substrate 2) of each of the spring structures 421C and 421D with the recess 428 (cutout). Providing part of the four spring structures 421 with the thin section 429 as described above allows reduction in the Z-axis-direction vibration component of the drive spring 42. The quadrature can therefore be reduced as compared with a configuration in which no thin section 429 is provided. The arrangement of the thin section 429 is not particularly limited to the arrangement described above as long as the Z-axis-direction vibration component of the drive spring 42 can be reduced, and only the spring structure 421D or 421C may be provided with the thin section 429.

The fifth embodiment described above can also provide the same effects as those provided by the first embodiment described above.

Sixth Embodiment

A physical quantity sensor according to a sixth embodiment of the invention will be described next.

Figure 21:
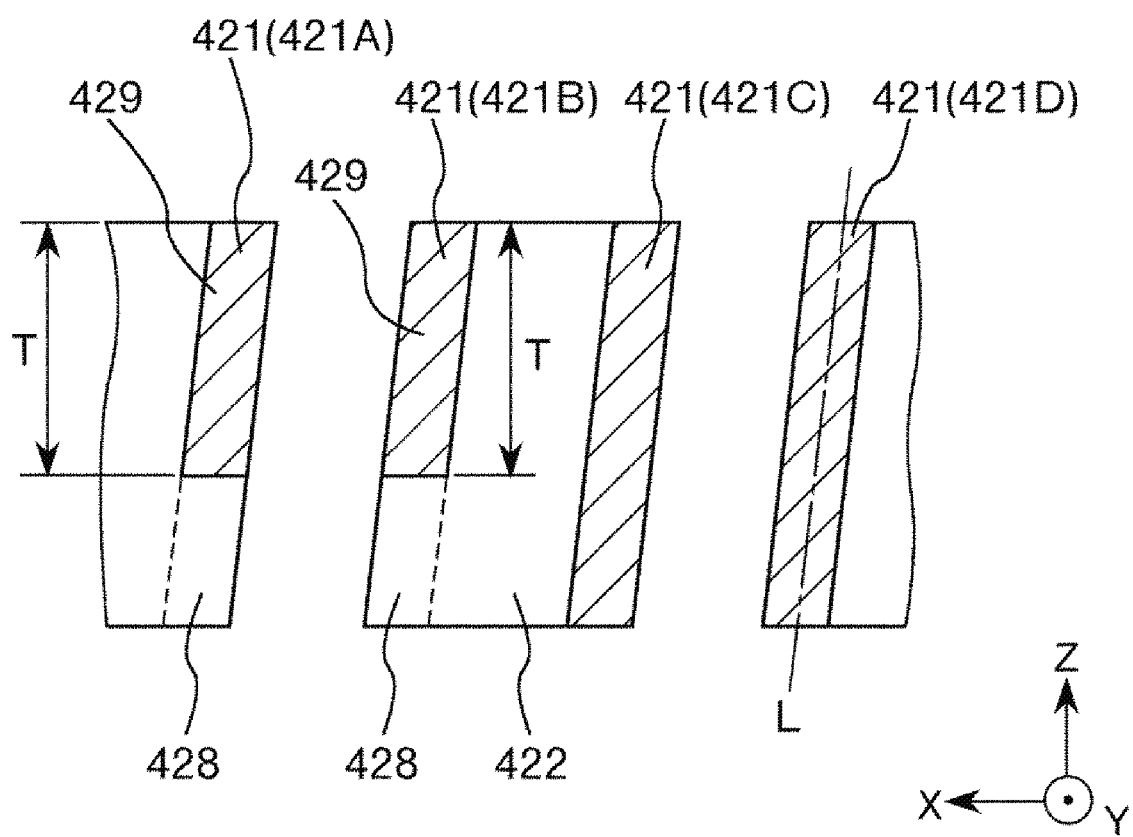
FIG. 21 is a cross-sectional view of a drive spring provided in a physical quantity sensor according to a sixth embodiment of the invention.

FIG. 21 is a cross-sectional view of a drive spring provided in the physical quantity sensor according to the sixth embodiment of the invention.

The physical quantity sensor according to the present embodiment is the same as the physical quantity sensor according to the first embodiment described above except that the element (drive springs, in particular) is configured differently.

In the following description, the physical quantity sensor according to the sixth embodiment will be described primarily on the difference from the first embodiment described above, and the same items will not be described. Further, in FIG. 21, the same configurations as those in the first embodiment described above have the same reference characters.

In each of the drive springs 42 in the present embodiment, the four spring structures 421 incline so that the upper ends thereof shift from the lower ends thereof toward the negative side in the X-axis direction, as shown in FIG. 21. That is, the inclining direction of the spring structures 421 is opposite the inclining direction in the first embodiment described above. In the present embodiment, the direction in which the upper end of the major axis L shifts from the lower end thereof, that is, the X-axis direction is also called "the inclining direction of the major axis L," and the positive side in the X-axis direction is also called "the front end side in the inclining direction of the major axis L."

Out of the four spring structures 421, the spring structures 421A and 421B, which are located on the front end side in the inclining direction of the major axis L, are each provided with the thin section 429 having a thickness T (length in Z-axis direction, or height (even though from the top down in this instance)) smaller than that of the other spring structures 421. The thin section 429 is formed by providing the lower surface (principal surface facing substrate 2) of each of the spring structures 421A and 421B with the recess 428 (cutout). Providing part of the four spring structures 421 with the thin section 429 as described above allows reduction in the Z-axis-direction vibration component of the drive spring 42. The quadrature can therefore be reduced as compared with a configuration in which no thin section 429 is provided. The arrangement of the thin section 429 is not particularly limited to the arrangement described above as long as the Z-axis-direction vibration component of the drive spring 42 can be reduced, and only the spring structure 421A or 421B may be provided with the thin section 429.

The sixth embodiment described above can also provide the same effects as those provided by the first embodiment described above.

Seventh Embodiment

A physical quantity sensor device according to a seventh embodiment of the invention will be described next.

Figure 22:
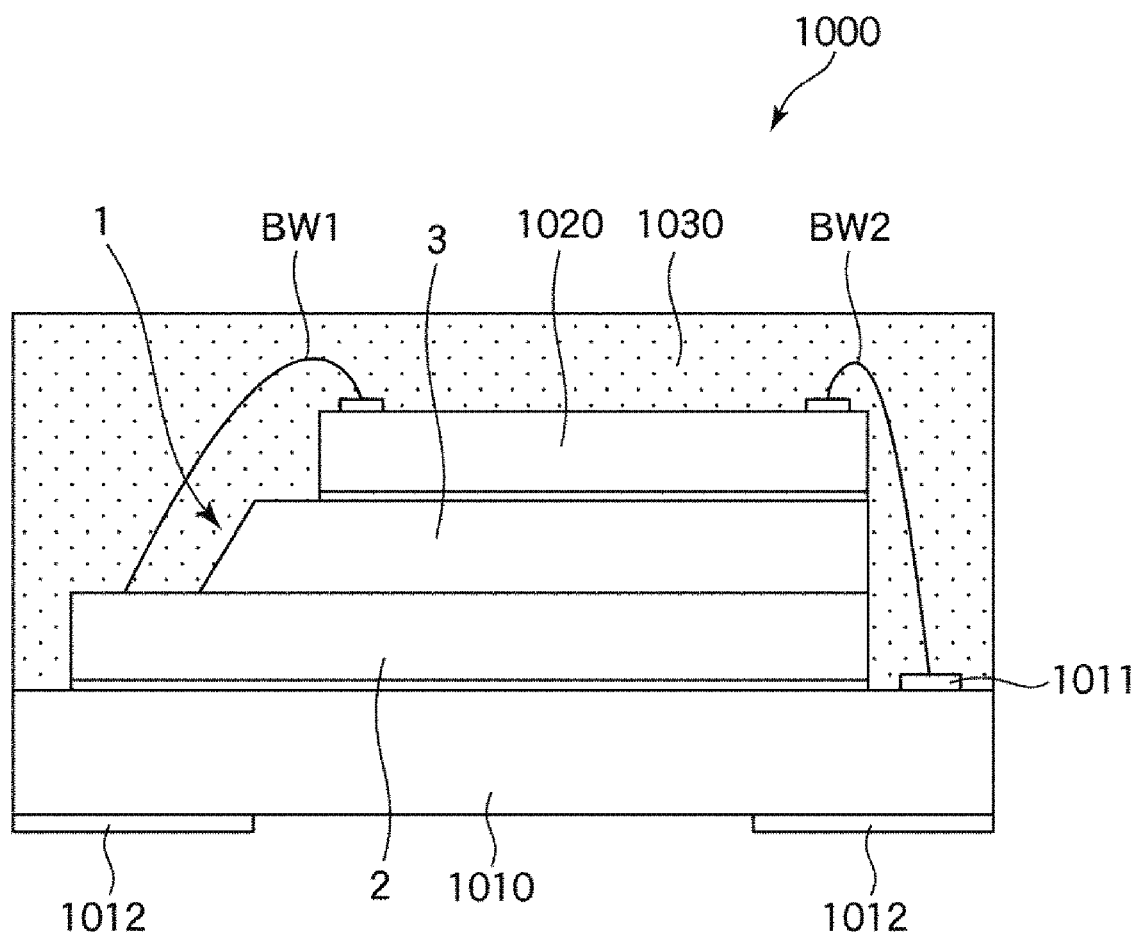
FIG. 22 is a cross-sectional view showing a physical quantity sensor device according to a seventh embodiment of the invention.

FIG. 22 is a cross-sectional view showing the physical quantity sensor device according to the seventh embodiment of the invention.

A physical quantity sensor device 1000 includes a base substrate 1010, a physical quantity sensor 1 provided on the base substrate 1010, a circuit element 1020 (IC) provided on the physical quantity sensor 1, bonding wires BW1, which electrically connect the physical quantity sensor 1 to the circuit element 1020, bonding wires BW2, which electrically connect the base substrate 1010 to the circuit element 1020, and a molding section 1030, which molds the physical quantity sensor 1 and the circuit element 1020, as shown in FIG. 22. The physical quantity sensor 1 can, for example, be any of those according to the first to third embodiments described above.

The base substrate 1010 is a substrate that supports the physical quantity sensor 1 and is, for example, an interposer substrate. A plurality of connection terminal 1011 are arranged on the upper surface of the base substrate 1010, and a plurality of implementation terminals 1012 are arranged on the lower surface of the base substrate 1010. Internal wiring lines that are not shown are routed in the base substrate 1010, and the connection terminals 1011 are electrically connected to the corresponding implementation terminals 1012 via the internal wiring lines. The thus configured base substrate 1010 is not limited to a specific substrate and can, for example, be a silicon substrate, a ceramic substrate, a resin substrate, a glass substrate, or a glass epoxy substrate.

The physical quantity sensor 1 is disposed on the base substrate 1010 with the lower side of the substrate 2 facing downward (base substrate 1010). The physical quantity sensor 1 is bonded to the base substrate 1010 via a bonding member.

The circuit element 1020 is disposed on the physical quantity sensor 1. The circuit element 1020 is bonded to the lid 3 of the physical quantity sensor 1 via a bonding member. The circuit element 1020 is electrically connected to the electrode pads P on the physical quantity sensor 1 via the bonding wires BW1 and electrically connected to the connection terminals 1011 on the base substrate 1010 via the bonding wires BW2. The thus configured circuit element 1020 includes, as required, a drive circuit that drives the physical quantity sensor 1, a detection circuit that detects angular velocity based on an output signal from the physical quantity sensor 1, an output circuit that converts a signal from the detection circuit into a predetermined signal and outputs the predetermined signal, and other circuits.

The molding section 1030 molds the physical quantity sensor 1 and the circuit element 1020. The molding section 1030 can therefore protect the physical quantity sensor 1 and the circuit element 1020 from moisture, dust, impact, and other undesirable factors. The molding section 1030 is not necessarily made of a specific material and can, for example, be made of a thermosetting epoxy resin and can be molded, for example, by using a transfer molding method.

The physical quantity sensor device 1000 described above includes the physical quantity sensor 1. A reliable physical quantity sensor device 1000 that can benefit from the effects of the physical quantity sensor 1 can therefore be provided.

The configuration of the physical quantity sensor device 1000 is not limited to the configuration described above. For example, the physical quantity sensor 1 may be accommodated in a ceramic package.

Eighth Embodiment

An electronic apparatus according to an eighth embodiment of the invention will be described next.

Figure 23:
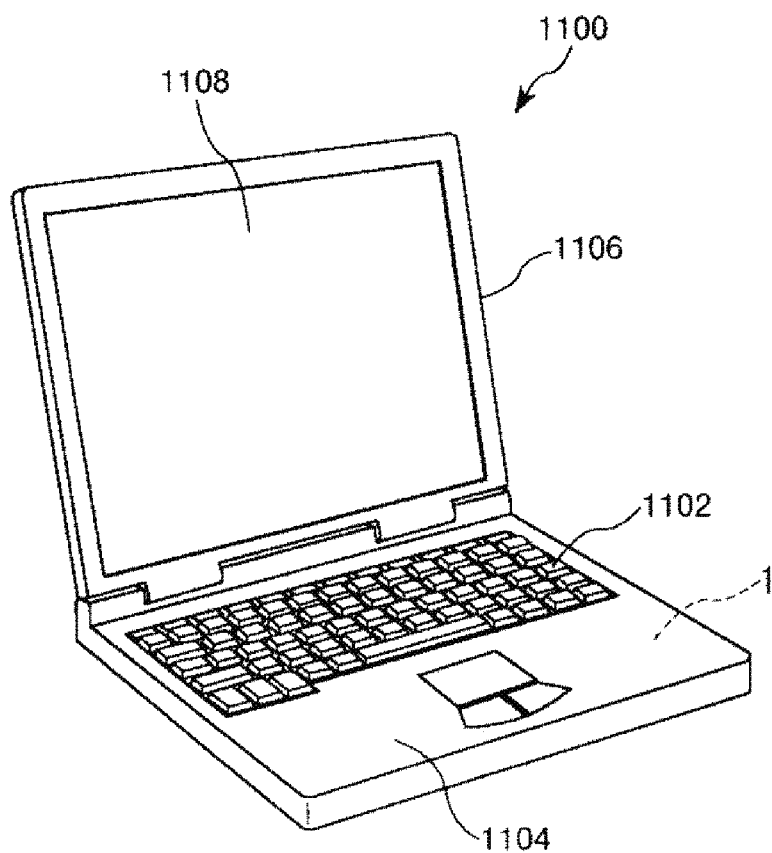
FIG. 23 is a perspective view showing an electronic apparatus according to an eighth embodiment of the invention.

FIG. 23 is a perspective view showing the electronic apparatus according to the eighth embodiment of the invention.

A mobile (or notebook) personal computer 1100 shown in FIG. 23 is an example of an electronic apparatus including the physical quantity sensor according to any of the embodiments of the invention. In FIG. 23, the personal computer 1100 is formed of a main body 1104 including a keyboard 1102 and a display unit 1106 including a display 1108, and the display unit 1106 is supported by the main body 1104 via a hinge structure so that the display unit 1106 is pivotable relative to the main body 1104. The thus configured personal computer 1100 includes a built-in physical quantity sensor 1 that functions as an angular velocity sensor. The physical quantity sensor 1 can, for example, be any of those according to the embodiments described above.

The personal computer 1100 (electronic apparatus) described above includes the physical quantity sensor 1 and can therefore benefit from the effects of the physical quantity sensor 1 described above and provide high reliability.

Ninth Embodiment

An electronic apparatus according to a ninth embodiment of the invention will be described next.

Figure 24:
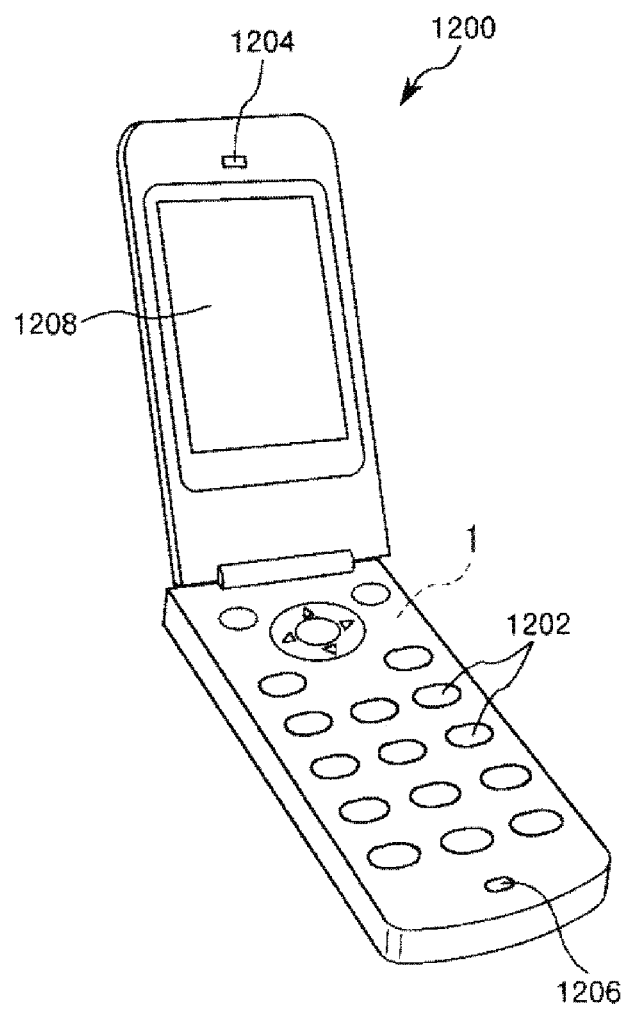
FIG. 24 is a perspective view showing an electronic apparatus according to a ninth embodiment of the invention.

FIG. 24 is a perspective view showing the electronic apparatus according to the ninth embodiment of the invention.

A mobile phone 1200 (including PHS) shown in FIG. 24 is another example of the electronic apparatus including the physical quantity sensor according to any of the embodiments of the invention. In FIG. 24, the mobile phone 1200 includes an antenna (not shown), a plurality of operation buttons 1202, a voice receiver 1204, and a voice transmitter 1206, and a display 1208 is disposed between the operation buttons 1202 and the voice receiver 1204. The thus configured mobile phone 1200 includes a built-in physical quantity sensor 1 that functions as an angular velocity sensor. The physical quantity sensor 1 can, for example, be any of those according to the embodiments described above.

The mobile phone 1200 (electronic apparatus) described above includes the physical quantity sensor 1 and can therefore benefit from the effects of the physical quantity sensor 1 described above and provide high reliability.

Tenth Embodiment

An electronic apparatus according to a tenth embodiment of the invention will be described next.

Figure 25:
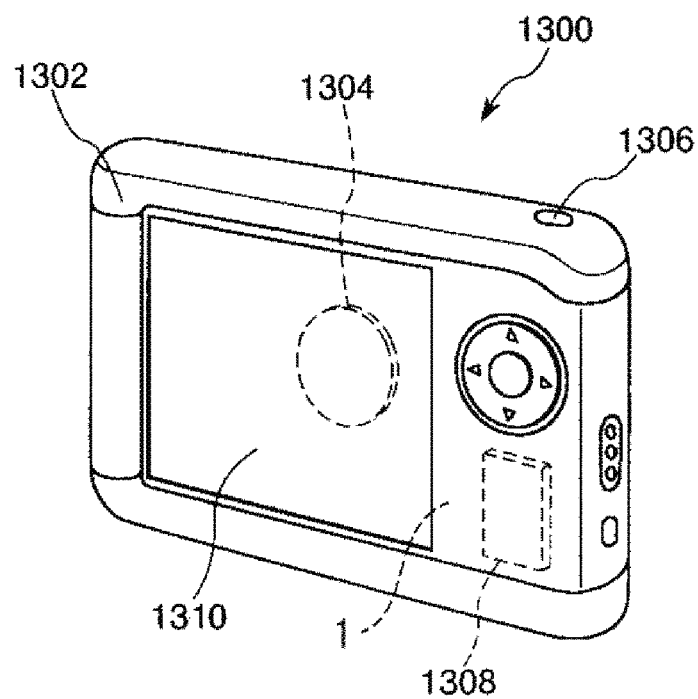
FIG. 25 is a perspective view showing an electronic apparatus according to a tenth embodiment of the invention.

FIG. 25 is a perspective view showing the electronic apparatus according to the tenth embodiment of the invention.

A digital still camera 1300 shown in FIG. 25 is another example of the electronic apparatus including the physical quantity sensor according to any of the embodiments of the invention. In FIG. 25, a display 1310 is provided on the rear side of a case (body) 1302 and performs display based on a captured image signal from a CCD. The display 1310 thus functions as a finder that displays a subject in the form of an electronic image. Further, a light receiving unit 1304 including an optical lens (imaging system), the CCD, and other components is provided on the front side (rear side in FIG. 25) of the case 1302. When a user who uses the camera for photographing checks a subject image displayed in the display 1310 and presses a shutter button 1306, a captured image signal from the CCD at that point of time is transferred to and stored in a memory 1308. The thus configured digital still camera 1300 includes a built-in physical quantity sensor 1 that functions as an angular velocity sensor. The physical quantity sensor 1 can, for example, be any of those according to the embodiments described above.

The digital still camera 1300 (electronic apparatus) described above includes the physical quantity sensor 1 and can therefore benefit from the effects of the physical quantity sensor 1 described above and provide high reliability.

The electronic apparatus according to an embodiment of the invention is not limited to the personal computer or the mobile phone shown according to the embodiments described above or the digital still camera according to the present embodiment and can, for example, be a smartphone, a tablet terminal, a timepiece (including smartwatch), an inkjet-type liquid ejection apparatus (inkjet printer, for example), a laptop personal computer, a television receiver, an HMD (head mounted display) and other wearable terminals, a video camcorder, a video tape recorder, a car navigator, a pager, an electronic notebook (including electronic notebook having communication capability), an electronic dictionary, a desktop calculator, an electronic game console, a word processor, a workstation, a TV phone, a security television monitor, electronic binoculars, a POS terminal, a medical apparatus (such as electronic thermometer, blood pressure gauge, blood sugar meter, electrocardiograph, ultrasonic diagnostic apparatus, and electronic endoscope), a fish finder, a variety of measuring apparatus, an apparatus for a mobile terminal/base station, a variety of instruments (such as instruments in vehicles, airplanes, and ships), a flight simulator, and a network server.

Eleventh Embodiment

A vehicle according to an eleventh embodiment of the invention will be described next.

Figure 26:
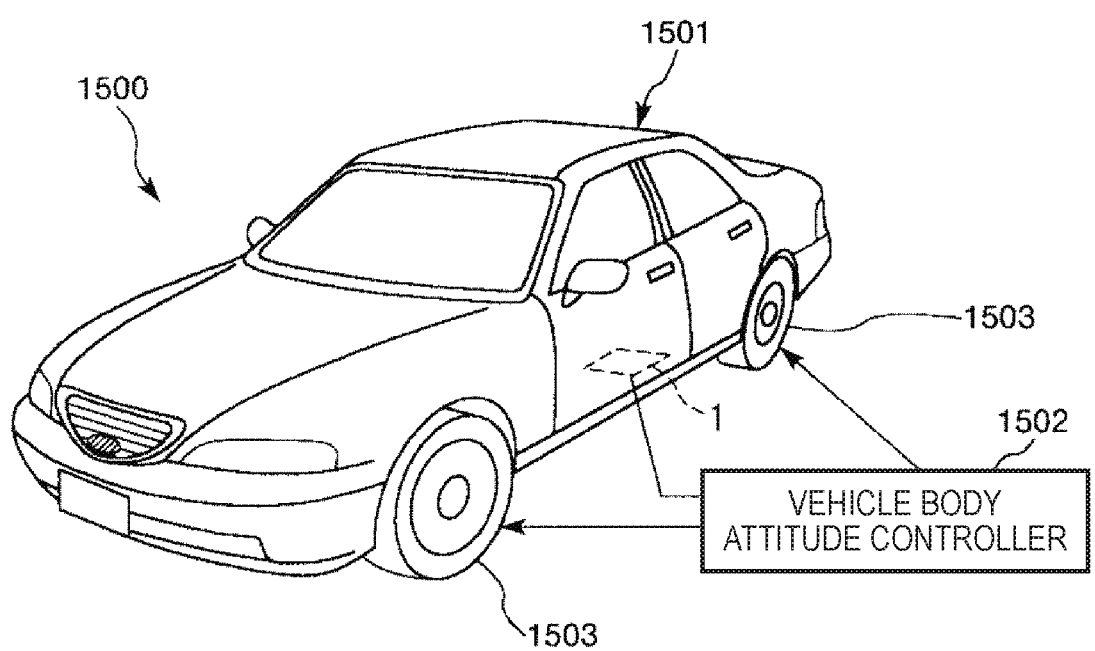
FIG. 26 is a perspective view showing a vehicle according to an eleventh embodiment of the invention.

FIG. 26 is a perspective view showing the vehicle according to the eleventh embodiment of the invention.

An automobile 1500 shown in FIG. 26 is an automobile that is an example of a vehicle including the physical quantity sensor according to any of the embodiments of the invention. In FIG. 26, the automobile 1500 has a built-in physical quantity sensor 1 that functions as an angular velocity sensor, and the physical quantity sensor 1 can detect the attitude of a vehicle body 1501. A detection signal from the physical quantity sensor 1 is supplied to a vehicle body attitude controller 1502, and the vehicle body attitude controller 1502 can detect the attitude of the vehicle body 1501 based on the signal, control the degree of hardness of the suspension, and perform braking control on individual wheels 1503 in accordance with the result of the detection. The physical quantity sensor 1 can, for example, be any of those according to the first to third embodiments described above.

The automobile 1500 described above includes the physical quantity sensor 1 and can therefore benefit from the effects of the physical quantity sensor 1 described above and provide high reliability.

The physical quantity sensor 1 can also be widely used, for example, with a car navigation system, a car air conditioner, an anti-lock braking system (ABS), an airbag, a tire pressure monitoring system (TPMS), an engine control system, and an electronic control unit (ECU) that monitors or otherwise observes a battery in a hybrid automobile and an electric automobile.

The vehicle is not limited to the automobile 1500 and may instead, for example, be an airplane, a rocket, an artificial satellite, a ship, an AGV (automated guided vehicle), a bipedal walking robot, and a drone or any other unmanned airplane.

The physical quantity sensor, the method for manufacturing the physical quantity sensor, the physical quantity sensor device, the electronic apparatus, and the vehicle according to the embodiments of the invention have been described with reference to the drawings, but the invention is not limited thereto, and the configuration of each portion can be replaced with an arbitrary configuration having the same function. Further, any other arbitrary component can be added to the embodiments of the invention. In the embodiments described above, the X-axis direction (first direction) and the Y-axis direction (second direction) are perpendicular to each other, but not necessarily, and only need to intersect each other.

In the invention, the embodiments described above may be combined with each other as desired. For example, the four drive springs 42 provided in the structure 40a, out of the structures 40a and 40b, may incline so that the upper ends of the spring structures 421 shift from the lower ends thereof toward the negative side in the X-axis direction as in the fifth and sixth embodiments described above, and the four drive springs 42 provided in the structure 40b, out of the structures 40a and 40b, may incline so that the upper ends of the spring structures 421 shift from the lower ends thereof toward the positive side in the X-axis direction as in the first and fourth embodiments described above. Conversely, the four drive springs 42 provided in the structure 40a may incline so that the upper ends of the spring structures 421 shift from the lower ends thereof toward the positive side in the X-axis direction as in the first and fourth embodiments described above, and the four drive springs 42 provided in the structure 40b may incline so that the upper ends of the spring structures 421 shift from the lower ends thereof toward the negative side in the X-axis direction as in the fifth and sixth embodiments described above. That is, the inclination direction of the spring structures 421 in at least one of the plurality of drive springs 42 may differ from the inclination direction of the spring structures 421 in the other drive springs 42.

The aforementioned embodiments have been described with reference to the configuration in which the number of elements is one. A plurality of elements may instead be provided. In this case, disposing the plurality of elements so that the detection axes differ from one another allows detection of acceleration in the plurality of axial directions.

The aforementioned first embodiment has been described with reference to the configuration in which the detection flap plates pivot around the pivotal axes. The detection flap plates may be displaced in any manner as long as they are allowed to be displaced in the Z-axis direction. For example, the detection flap plates may seesaw swing around the pivotal axes or may be displaced in the Z-axis direction with the attitude thereof maintained. That is, the physical quantity sensor may be a seesaw-swing-type physical quantity sensor or a parallel-plane-type physical quantity sensor.

The aforementioned embodiments have been described with reference to the configuration in which the physical quantity sensor is an angular velocity sensor that detects angular velocity. The physical quantity detected with the physical quantity sensor is not limited to angular velocity and may, for example, be acceleration or pressure.

The entire disclosure of Japanese Patent Application No. 2017-086119 filed Apr. 25, 2017 is expressly incorporated herein by reference.

What is claimed is:

1. A physical quantity sensor comprising:
a driven member; and
a spring that supports the driven member,
wherein the driven member and the spring are arranged in a first direction relative to each other,
the spring includes:
a plurality of span spring members longitudinally extending in a second direction perpendicular to the first direction; and
connector spring members connecting adjacent ends of adjacent pairs of the plurality of span spring members,
at least one of the plurality of span spring members has a smaller height than the other spring members in a third direction perpendicular to the first and second directions, and
wherein a width of each of the span spring members in the first direction is smaller than a distance by which adjacent pairs of the span spring members are separated from each other.

2. The physical quantity sensor according to claim 1, wherein the at least one of the span spring members includes a recess in one side in the third direction.

3. The physical quantity sensor according to claim 1, wherein each of the plurality of span spring members has an elongated cross-sectional shape, and
long sides of the elongated shape incline with respect to the third direction.

4. The physical quantity sensor according to claim 3, wherein the at least one of the span spring members is located on a front end side in a direction in which the long sides incline.

5. The physical quantity sensor according to claim 1, wherein at least two of the plurality of span spring members have the smaller height.

6. The physical quantity sensor according to claim 5, wherein the at least two springs members have the same height.

7. A method for manufacturing a physical quantity sensor, the method comprising:
patterning a substrate by using dry etching to form an element including:
a driven member; and
a spring that supports the driven member,
the driven member and the spring arranged in a first direction relative to each other,
the spring including:
a plurality of span spring members longitudinally extending in a second direction perpendicular to the first direction; and
connector spring members connecting adjacent ends of adjacent pairs of the plurality of span spring members; and
reducing a height of at least one of the plurality of span spring members so that the at least one spring member has a smaller height than the other spring members in a third direction perpendicular to the first and second directions,
wherein a width of each of the span spring members in the first direction is smaller than a distance by which adjacent pairs of the span sprin members are separated from each other.

8. The method for manufacturing a physical quantity sensor according to claim 7,
wherein the reducing of the height includes processing the spring via a mask by using the dry etching.

9. A physical quantity sensor device comprising:
the physical quantity sensor according to claim 1; and
a circuit element electrically connected to the physical quantity sensor.

10. A vehicle comprising:
the physical quantity sensor according to claim 1; and
an attitude controller that controls an attitude of the vehicle based on a detection signal outputted from the physical quantity sensor.

11. A physical quantity sensor comprising:
a substrate;
a serpentine spring meandering between an anchor end and a frame end, the anchor end being joined to the substrate; and
a driven frame joined to the frame end of the spring so as to reside laterally adjacent to the spring in a first direction,
wherein the spring includes a plurality of meanders, each meander including a pair of span spring members and a connector spring member interconnecting adjacent ends of the pair of spring members, each of the span spring members longitudinally extending in a second direction perpendicular to the first direction, and
at least one of the span spring members has a recess in a third direction perpendicular to the first and second directions.

12. The physical quantity sensor according to claim 11, wherein each of the plurality of span spring members has a pair of opposed major surfaces and a pair of opposed minor surface, and
the pair of major surfaces are inclined with respect to the third direction.

13. The physical quantity sensor according to claim 11, wherein the at least one of the span spring members is proximate the anchor end of the spring.

14. The physical quantity sensor according to claim 11, wherein at least two of the plurality of span spring members have the recess.

15. The physical quantity sensor according to claim 14, wherein the at least two spring members have the same height.

16. The physical quantity sensor according to claim 1, wherein a width of each of the span spring members in the first direction is smaller than a distance by which adjacent pairs of the span spring members are separated from each other.

17. The physical quantity sensor according to claim 11, wherein each of the plurality of span spring members is elongated substantially along the third direction and has a pair of opposed major surfaces and a pair of opposed minor surface, and
the recess is formed in one of the pair of minor surfaces.

18. The physical quantity sensor according to claim 17, wherein the one of the pair of minor surfaces faces away from the substrate.

19. The physical quantity sensor according to claim 18, wherein the recess extends along an entirety of the one of the pair of minor surfaces.

\* \* \* \* \*